(12) United States Patent
Sogard

(10) Patent No.: US 7,342,641 B2
(45) Date of Patent: Mar. 11, 2008

(54) AUTOFOCUS METHODS AND DEVICES FOR LITHOGRAPHY

(75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 2 days.

(21) Appl. No.: 11/064,169

(22) Filed: Feb. 22, 2005

(65) Prior Publication Data

US 2006/0187434 A1    Aug. 24, 2006

(51) Int. Cl.
  *G03B 27/52*  (2006.01)
  *G03B 27/54*  (2006.01)
(52) U.S. Cl. .......................................... 355/55; 355/67
(58) Field of Classification Search ................. 355/55, 355/56, 57, 60, 67, 53; 356/498, 509
See application file for complete search history.

(56) References Cited

U.S. PATENT DOCUMENTS

| | | | |
|---|---|---|---|
| 5,171,999 A | 12/1992 | Komatsu et al. | |
| 5,825,043 A | 10/1998 | Suwa | 250/548 |
| 6,020,964 A | 2/2000 | Loopstra et al. | 356/358 |
| 6,094,268 A | 7/2000 | Oshida et al. | |
| 6,191,429 B1* | 2/2001 | Suwa | 250/548 |
| 6,208,407 B1 | 3/2001 | Loopstra | 355/53 |
| 2002/0041368 A1 | 4/2002 | Ota et al. | 355/55 |
| 2002/0070355 A1 | 6/2002 | Ota | 250/492.2 |
| 2003/0169411 A1 | 9/2003 | Ota | 355/55 |
| 2003/0211402 A1* | 11/2003 | Hill | 430/5 |
| 2004/0203177 A1* | 10/2004 | Davis et al. | 438/14 |
| 2006/0072093 A1* | 4/2006 | de Jager | 355/55 |

FOREIGN PATENT DOCUMENTS

| | | |
|---|---|---|
| EP | 1347336 | 9/2003 |
| WO | 0956518 | 6/1999 |

OTHER PUBLICATIONS

International Search Report, dated Sep. 11, 2006 and mailed Oct. 2, 2006, from corresponding International Application No. PCT/US2006/005623, 6 pp. including Notification of Transmittal.
Written Opinion of the International Searching Authority, dated Sep. 11, 2006 and mailed Oct. 2, 2006 from corresponding International Application No. PCT/US2006/005623, 5 pp.
Oshida, Y., et al., "Chip Leveling and Focusing With Laser Interferometry" Proceedings of the SPEI, SPIE, Bellingham, VA, US. vol. 1264, 1990, pp. 244-251, SP000886476, ISSN: 0277-786X.

* cited by examiner

*Primary Examiner*—Henry Hung Nguyen
(74) *Attorney, Agent, or Firm*—Beyer Weaver LLP

(57) ABSTRACT

Improved autofocusing ("AF") methods and devices for lithography are provided. Some embodiments of the invention provide an AF system that includes one or more interferometers for measuring a distance to a wafer surface or a reticle surface. The invention includes methods and devices for calibrating the interferometer(s) according to known distances to a target. According to some embodiments of the invention, a spatial filter reduces the amount of undesired signal coming from the wafer or reticle surface. In some such embodiments, higher orders of diffracted light from the wafer or reticle multilayer surfaces are eliminated with a pinhole filter oriented to reject light that is not vertically directed. Other embodiments include a spatial filtering system that passes a selected diffraction order, e.g., the first order of diffracted light, from the target.

24 Claims, 21 Drawing Sheets

AUTOFOCUS METHODS AND DEVICES FOR LITHOGRAPHY

BACKGROUND OF THE INVENTION

This invention relates to autofocus devices and methods for use in lithography.

Currently, at the sites which manufacture semiconductor devices, circuit devices are mass-produced by using reduction projection exposure devices, using the i line from mercury lamps that has a wavelength of 365 nm as an illumination light. At the same time, the introduction of exposure devices of the next generation, having minimum line widths of 0.25 µm, has begun.

A scanning exposure apparatus based on the step-and-scan method is being developed. This apparatus uses an ultraviolet pulse laser beam with a wavelength of 248 nm from a KrF excimer laser source or an ultraviolet pulse laser beam with a wavelength of 193 nm from an ArF excimer laser source as an illumination light. A scanning exposure apparatus then linearly scans a mask or a reticle (to be generically referred to as a "reticle" hereinafter) on which a circuit pattern is drawn and a wafer serving as a photosensitive substrate, relatively to the projection field of a reduction projection optical system. This allows the transfer of the entire pattern within a shot area on the wafer by repeating the inter-shot stepping operation and the scanning exposure operation.

It seems apparent that the integration degree of semiconductor devices will further increase, requiring increased resolution of the scanning exposure apparatus. In order to increase this resolution, it is extremely effective to decrease the wavelength $\lambda$. For this reason, an EUV exposure apparatus using light in the soft X-ray region of 5 to 15 nm in wavelength ("EUV (Extreme Ultraviolet) light") as the exposure light has been developed.

In semiconductor lithography systems in use today, automatic focusing and leveling (AF/AL) is typically accomplished by passing a low angle of incidence ("glancing angle") optical beam onto the surface of a silicon wafer and detecting its position after subsequent reflection from the wafer surface. The wafer height is determined by optical and electrical processing of the reflected light beam. This beam passes under the last element of the projection lens. The source and receiver optics are typically mounted to a stable part of the system, close to the projection optics mounting position. Signals from the AF/AL unit go to the wafer stage controller which adjusts the wafer height and leveling appropriately, so the wafer lies in the focal plane of the projection optics.

In an EUV exposure apparatus, a reflection type reticle is required, due to the high absorption of EUV light by all materials. This reflection type reticle is obliquely irradiated with illumination light and light reflected by the reticle surface is projected on a wafer through a reflective projection optical system. As a consequence, a pattern, which is irradiated with the illumination light in an illumination area on the reticle, is transferred onto the wafer.

For this reason, the projection optical system becomes non-telecentric on the reticle side. As a consequence, the displacement of the reticle along the optical axis appears on the wafer as a magnification change in the longitudinal direction of a ring-shaped exposure area (an area on the wafer which corresponds to the above ring-shaped illumination area on the reticle), and as a positional change in the transversal direction.

Non-telecentric projection optical systems are very sensitive to reticle displacement. When, for example, the reticle is displaced by 1 µm in the vertical direction (Z direction), while illuminated by radiation incident at an oblique angle of 100 mrad, an image shift of 25 nm (assuming a 4× reduction optical system), occurs on the wafer. The allowable overlay error in the semiconductor process of a device rule of 100 nm L/S is said to be 30 nm or less. Therefore, an overlay error as large as 25 nm caused by a displacement of a reticle in the Z direction alone poses a serious problem. This is because overlay errors of about 10 nm can be caused by other factors, e.g., alignment accuracy of a reticle and wafer, wafer stage alignment accuracy including stepping accuracy, or the distortion of the projection optical system.

Conventional glancing angle AF devices are large and may not have the accuracy required for future applications. For application to EUV reticle height sensing, the glancing angle of such AF devices may cause interference between the AF beams and proximity illumination blinds or other structures. Also, their accuracy may be inadequate for the <50 nm height tolerance of the EUV reticle.

Conventional glancing angle AF devices also pose problems for immersion lithography systems. In immersion lithography, a liquid such as water fills the space between the last surface of the projection lens and the wafer. At the edge of the water, typically at the edge of the lens or supported structure near the edge of the lens, the liquid-air boundary may not be well defined and may be changing rapidly. Temperature gradients in the water also cause problems for the AF. Transmitting an AF/AL beam through this interface using prior art AF systems causes substantial disruption and subsequent loss of signal, and hence performance.

It is therefore a general object of this invention to provide improved AF systems and methods for lithography.

SUMMARY OF THE INVENTION

The present invention provides improved AF methods and devices for lithography. Some embodiments of the invention provide an AF system that includes one or more interferometers for measuring a distance to a target such as a wafer surface or a reticle surface. The invention includes methods and devices for calibrating the interferometer(s) according to known distances to a target. According to some embodiments of the invention, a spatial filter reduces the amount of undesired signal coming from the wafer or reticle surface. In some such embodiments, higher orders of diffracted light from the wafer or reticle multilayer surfaces are eliminated with a pinhole filter oriented to reject light that is not vertically directed. Other embodiments include a spatial filtering system that passes a selected diffraction order, e.g., the first order of diffracted light, from the target. These spatial filters reduce variations in the signal and make further signal processing easier. Employing polarized light and polarization filters also serves to reduce background signal. By including a beam expander, the interferometer beam can sample a larger or smaller area on the wafer.

Some embodiments of the invention provide an autofocusing device for a lithography system. The autofocusing device includes the following elements: a light source; an interferometer system configured to determine a distance to a target based on first light received from the target; and a spatial filter system for passing selected components of the first light to an interferometer of the interferometer system. The interferometer system may include a plurality of interferometers and may be configured to determine the distance to the target based on a comparison of the first light with second light reflected from a reference mirror. The autofocusing device may include a polarizing filter for passing a selected polarization angle of the first light.

The spatial filter system may include a plurality of spatial filters. For example, the spatial filter system may include a first spatial filter for passing a specularly reflected component of the first light and a second spatial filter for passing a selected diffraction order of the first light. In some implementations, the spatial filter system includes a third spatial filter for passing both the specularly reflected component of the first light and the selected diffraction order of the first light.

The autofocusing device may also include a calibration device for determining an absolute distance to a target and/or for calibrating the autofocusing device for expected optical properties of the target. The target may be, for example, a surface of a wafer or a surface of a reticle. The expected optical properties may include an expected reflectivity of a target surface and/or an expected pattern on a target surface. The autofocusing device may include a device for moving the target in accordance with a determined distance. The autofocusing device may be configured to cause at least a portion of the first light to illuminate the target more than once e.g., by incorporating a beam splitter and a quarter wave plate.

Other embodiments of the invention provide a lithography system that includes the following components: an illumination source; an optical system; a reticle stage arranged to retain a reticle; a working stage arranged to retain a workpiece; an enclosure that surrounds at least a portion of the working stage, the enclosure having a sealing surface; and autofocusing device. The autofocusing device includes these elements: a light source; an interferometer system configured to determine a distance to a target based on first light received from the target; and a spatial filter system for passing selected components of the first light to an interferometer of the interferometer system. The optical system may be a telecentric optical system or a non-telecentric optical system. The lithography system may include one or more devices for disposing a fluid between the optical system and the workpiece.

Some embodiments of the invention provide an object, such as a wafer, an integrated circuit, etc., manufactured with a lithography system as described herein. One such embodiment provides a wafer on which an image has been formed by the lithography system.

Some implementations of the invention provide a method for making an object using a lithography process, the lithography process that utilizes a lithography system as described herein. Some aspects of the invention provide a method for patterning a wafer using a lithography process, wherein the lithography process utilizes a lithography system as described herein.

BRIEF DESCRIPTION OF THE DRAWINGS

The invention may best be understood by reference to the following description taken in conjunction with the accompanying drawings.

FIG. 13b shows a similar phasor relation to that of FIG. 12a.

DETAILED DESCRIPTION OF SPECIFIC EMBODIMENTS

In this application, numerous specific details are set forth in order to provide a thorough understanding of the present invention. It will be obvious, however, to one skilled in the art, that the present invention may be practiced without some or all of these specific details. In other instances, well known process steps have not been described in detail in order not to obscure the present invention.

The invention includes various AF devices and methods for reducing the amount of undesired signal coming from a wafer or reticle surface. A significant fraction of light reaching the wafer or reticle surface will be diffracted by the patterned surface. First-order diffracted light and higher orders of diffracted light from such a surface will not be oriented vertically, but instead will emerge at angles to normal incidence. According to some embodiments of the invention, first-order diffracted light and higher orders of diffracted light are eliminated with a pinhole spatial filter. The filter prevents light that is not vertically directed from re-entering an interferometer used to determine a distance to a target. The filter also prevents much of the light diffusely scattered from the reticle from reaching the interferometer.

Some AF devices of the invention incorporate a polarizer to attenuate scattered and diffracted light. Some AF devices according to the invention incorporate a beam expander for sampling a larger area on the target. Sampling a larger area reduces variations in the diffracted light signal and therefore makes signal processing easier.

Other embodiments of the invention include filters for passing a selected order of diffracted light. For example, the first-order diffracted light from a target may be selectively passed to an interferometer of the AF device.

Yet other embodiments of the invention provide methods and devices for calibrating an AF device. Known thicknesses of material are used to provide an absolute distance to a target, from which an interferometer (or interferometer system) may calculate relative differences in distance to another target. Moreover, known pattern types and/or reflectivities of the reticle or wafer may be used to calibrate the AF device.

Other embodiments of the invention provide means for measuring the variation in AF signal properties as a function of reticle or wafer pattern properties.

Figure 1:
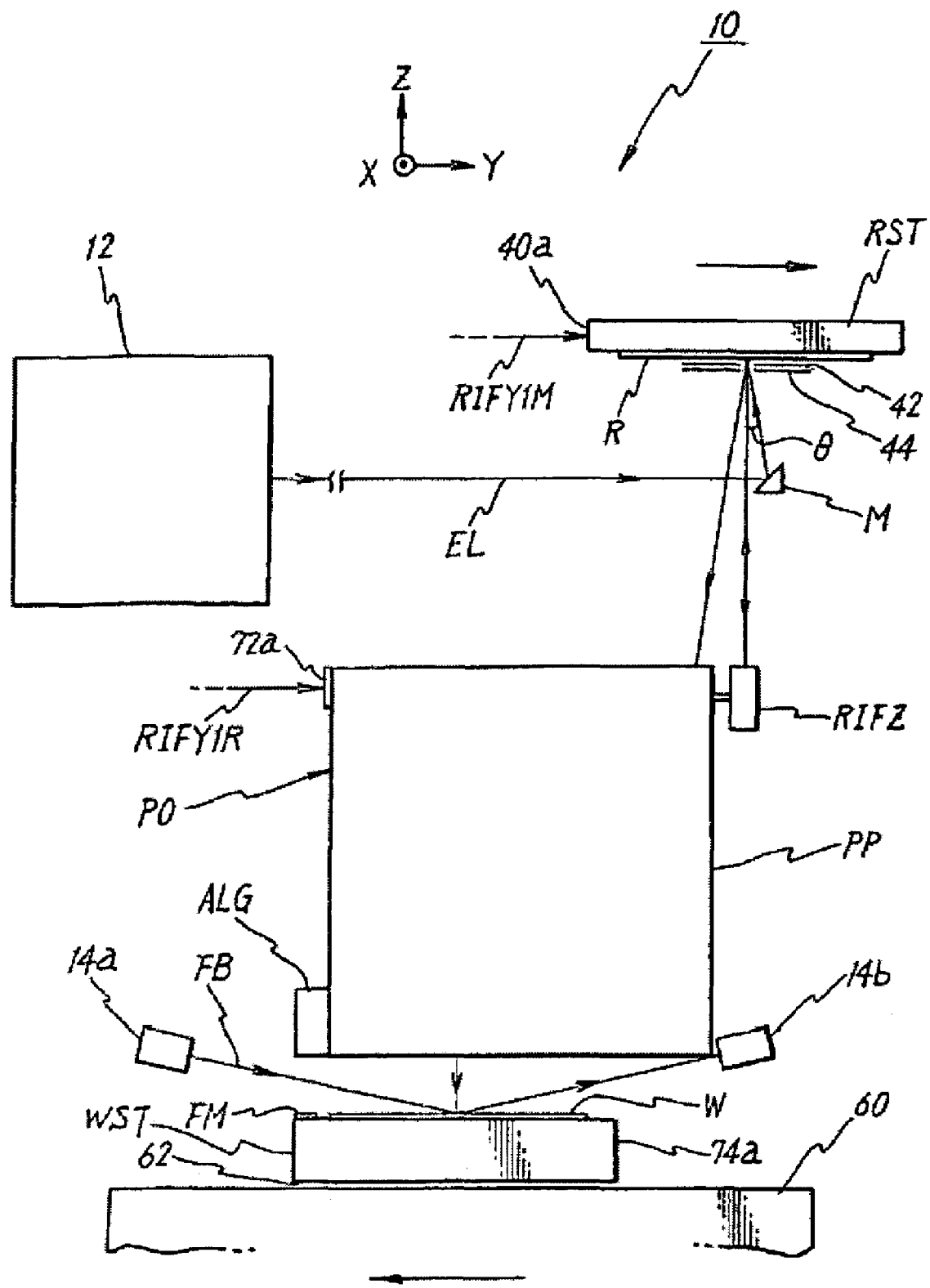
FIG. 1 illustrates the general structure of a non-telecentric projection exposure apparatus having a glancing angle AF device.

The present invention encompasses numerous AF devices and methods for use in various types of lithography systems. One such lithography system is a non-telecentric EUV lithography system. FIG. 1 shows the general structure of a EUV projection exposure apparatus having a glancing angle AF device. Exposure apparatus 10 is a projection exposure apparatus designed to perform exposure operations by the step-and-scan method using EUV light as the exposure illumination light EL. A projection optical system PO is used for projecting the reflected light beam from a reticle R as a mask onto a wafer W. The projecting direction, therefore, of the illumination light EL projected from the projection optical system PO onto the wafer W, will hereinafter be referred to as the optical axis direction of the projection optical system PO. The coordinate axes are shown in FIG. 1. The Y-axis direction is the lateral direction within the drawing surface of FIG. 1 in a plane perpendicular to the Z-axis direction and the X-axis direction is a direction perpendicular to the drawing surface.

The exposure apparatus 10 projects through the projection optical system PO, an image of a part of the circuit pattern drawn on the reflection type reticle R serving as a mask onto a wafer W serving as a substrate, while relatively scanning the reticle R and the wafer W in a linear direction (Y-axis direction in this case) in respect to the projection optical system PO. The entire circuit pattern of the reticle R is thus transferred respectively onto a plurality of shot areas on the wafer W by the step-and-scan method.

The exposure apparatus 10 includes a light source unit 12 for horizontally emitting EUV light EL along the Y direction, a deflection mirror M (part of an illumination optical system) for reflecting the EUV light EL from the light source unit 12 and bending its optical path to make the light incident on the pattern surface (lower surface in FIG. 1) of the reticle R at a predetermined incident angle theta (theta is about 50 mrad in this case), a reticle stage RST serving as a mask stage for holding the reticle R, the projection optical system PO made up of a reflection optical system which irradiates the EUV light EL reflected on the pattern surface of the reticle R in a direction perpendicular to the exposing surface of the wafer W, a wafer stage WST serving as a substrate stage for holding the wafer W, focus sensors (14a and 14b) and an alignment optical system ALG.

Figure 2:
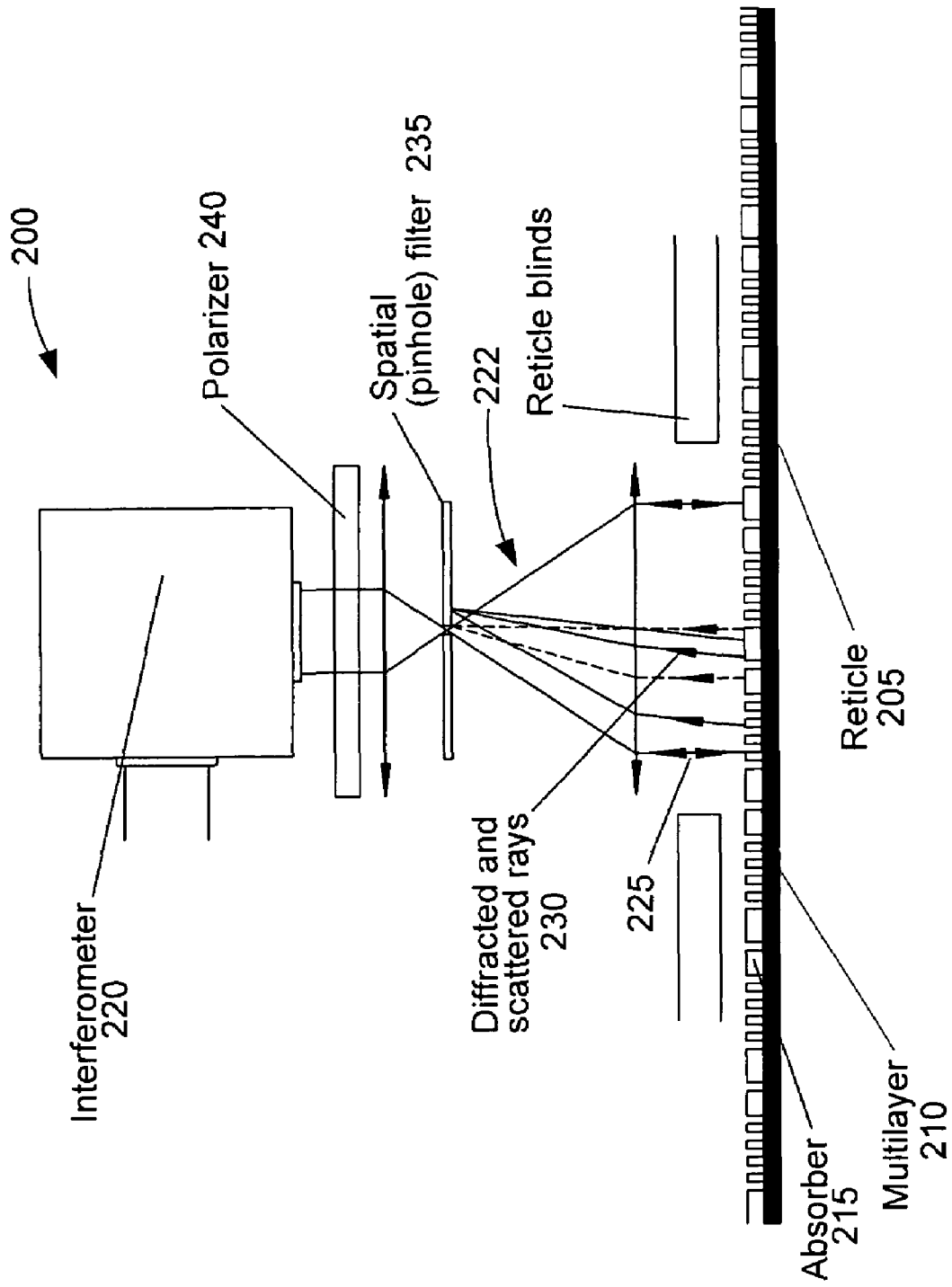
FIG. 2 illustrates one embodiment of an AF device according to the present invention.

As noted above, the glancing angle AF system shown in FIG. 1 has various drawbacks. FIG. 2 illustrates one exemplary AF device according to the present invention that is particularly suitable for non-telecentric lithography systems such as the EUV lithography system depicted in FIG. 1.

On the surface (pattern surface) of the reticle 205, a reflecting film for reflecting EUV light is formed. This reflecting film is a multilayer film 210 formed by alternately depositing layers consisting of two different materials. In this example, multilayer film 210 is made of molybdenum (Mo) and silicon (Si) and forms a reflecting film having a reflectance of about 70% with respect to EUV light having a wavelength of about 13 nm.

The reflecting film on reticle 205 is coated with absorber 215, made from a material that absorbs EUV light, and then patterning is performed. Since most materials do not reflect EUV light, many such materials can be used as the absorbing layer, e.g., chromium or tantalum silicide. The criteria for selection of the material for absorber 215 may include, for example, ease of patterning, adherence to the reflecting layer, the degree of age deterioration due to oxidation, maintaining a sufficient difference between the reflectance of multilayer 210 and absorber 215 at wavelengths used by mask inspection and metrology tools, etc.

In this embodiment, one or more laser interferometers 220 are used to measure the Z-direction position of the reticle 205. The interferometers are preferably rigidly mounted with respect to the projection optics, so that the reticle height can be directly related to the focal plane of the optics. In particular, this embodiment provides a measurement of the position of absorber 215 with respect to a known position of a reference mirror (not shown). If reflected light from the absorber layer can reliably be isolated according to the methods of the present invention, the relative position of absorber 215 may be determined according to interferometry techniques known by those of skill in the art. The discussion of interferometers in Jenkins and White, "Fundamentals of Optics," ($4^{th}$ edition, 1976), particularly that on pages 271 through 284, as well as "Interferometry with Lasers", by P. Hariharan in Progress in Optics, Vol. XXIV, 104(1987) are hereby incorporated by reference for all purposes.

The position of multilayer 210, which is generally the position of interest, may then be determined by adding the thickness of the absorber layer 215. Accordingly, with respect to AF measurement beams 222 (in the visible range) from these laser interferometers, it is important to be able to distinguish between signals reflecting or refracting from absorber 215 and those from multilayer 210. The position of multilayer 210, which is generally the position of interest, may then be determined by adding the thickness of absorber 215. In some instances, absorber 215 is significantly more reflective for AF beam 222 than multilayer 210. In such instances, the reflected signal 225 is mainly coming from absorber 215 and the diffracted and scattered rays 230 are primarily coming from multilayer 210. AF device 200 includes spatial filter 235 for isolating reflected signal 225. As shown in FIG. 2, filter 235 stops scattered rays and higher-order diffracted rays 230 from re-entering interferometer 220.

Moreover, many of the features patterned on reticle 205 will be much smaller than the wavelength of light used for AF beam 222. For example, if AF beam 222 is from a HeNe laser, the wavelength is approximately 633 nm, whereas EUV systems are designed to have a minimum line width of 100 nm or less. Therefore, scattering and large angle diffraction should be significant. The polarization angles of such scattered and diffracted light will typically differ from that of reflected light. Therefore, optional polarizer 240 will also help to attenuate the scattered and diffracted light received from reticle 205 by polarizer 240. Accordingly, the reflected light from absorber 215 should be relatively easy to isolate in this example. Therefore, the distance to the absorber surface may readily be determined, and this distance may be adjusted if necessary.

The reflectivity of the absorber and multilayer will vary with the wavelength of the interferometer light source. A proper choice of this wavelength may lead to an optimum contrast condition, where the reflectivity, or absorption, of the desired level is maximized with respect to the other one.

Figure 11:
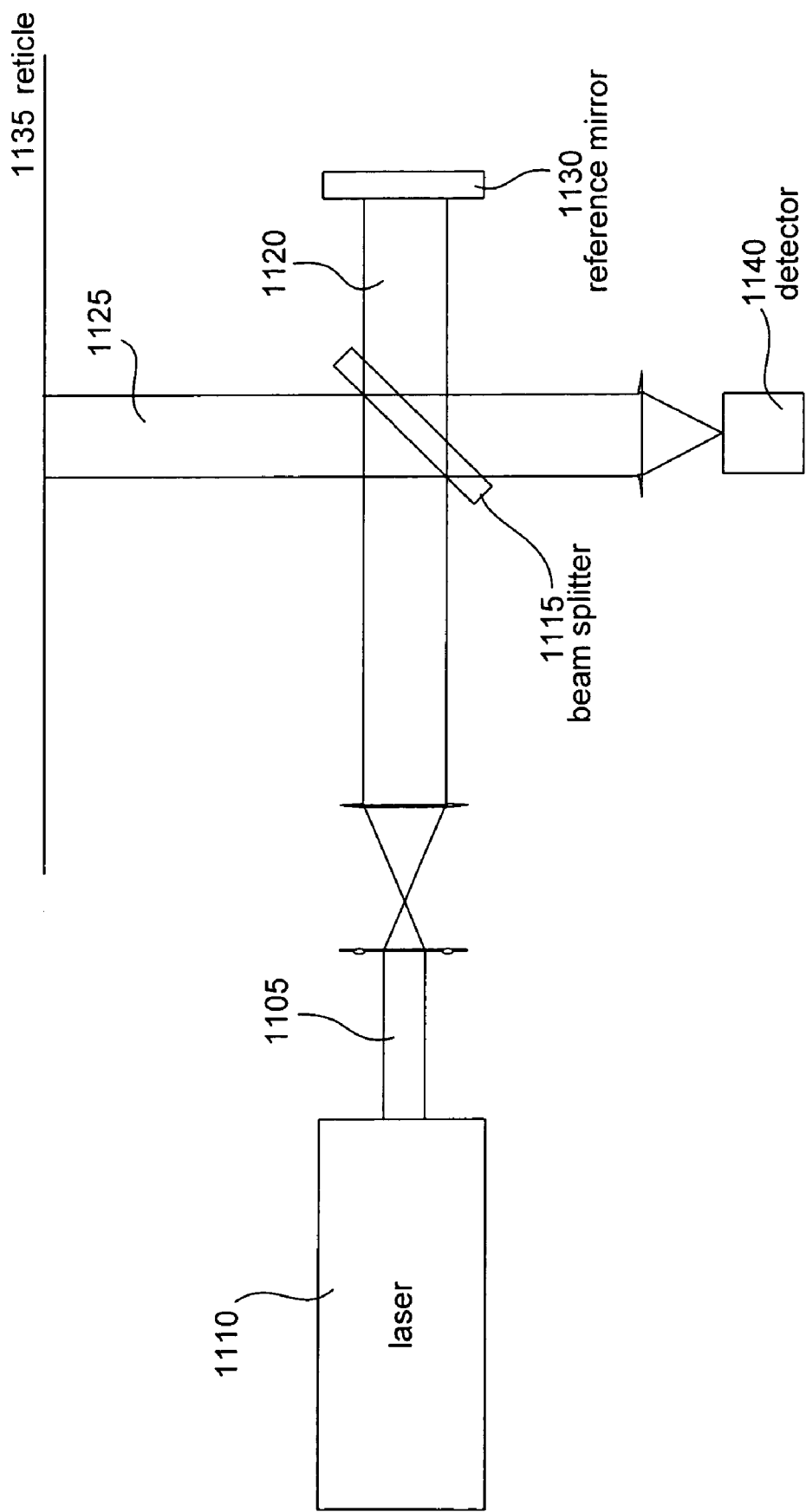
FIG. 11 illustrates the basic components of an interferometer used with the present invention.

Extraction of the height of the surface of the reticle multilayer from the interferometer signal is described here. Several different kinds of interferometers may be employed. The following analysis is based on a Twyman-Green interferometer employing a single wavelength. FIG. 11 illustrates the basic components of the interferometer. A beam of light 1105 from laser 1110 is divided in amplitude by a beam splitter 1115 into two beams 1120 and 1125, which are at right angles to one another. Beam 1120 is reflected from a fixed reference mirror (Ref) and beam 1125 is reflected from the reticle surface 1135 (Meas). The interferometer combines the two light beams at a detector 1140. Often, a fraction of the beams is deflected to another detector (not shown) with an additional phase of $\pi/2$ added to either the measurement beam or the reference beam. This additional signal allows the direction of vertical motion of the reticle to be determined. Not shown are other embodiments of the invention, such as the spatial filter or the polarizer.

The total electric field of the combined beams at the detector at time t is given by $$E(t) = E_{Ref} + E_{Meas} \quad (1)$$
$$= E_{Ref} + E_{absorber} + E_{Multilayer}$$
$$= Er\cos(\omega t + \delta r) + Eabs\cos(\omega t + \delta a + 4\pi(z-d)/\lambda) +$$
$$Eml\cos(\omega t + \delta ml + 4\pi z/\lambda),$$

where reflected beams from the absorber and multilayer are distinguished. Because of the spatial filtering provided by the pinhole aperture, the two beams should be of sufficient optical quality to provide adequate interferometer signals. The amplitudes of the two beams are Eabs and Eml respectively, and the amplitude of the reference beam is Er. The source of light for the interferometer is a laser; $\lambda$ is the wavelength and $\omega$ is the angular frequency of the laser light. The phase $\delta r$ is fixed by the reference mirror location and the calibration of the z axis, the measurement axis, as is described below. The phases $\delta a$ and $\delta ml$ represent the phase change of the light at reflection from the absorber surface and the multilayer respectively. The absorber layer is assumed to have thickness d, so the absorber interferometer beam path is shorter by 2d, assuming the measurement to be made in vacuum, compared to the multilayer beam path.

Eq. 1 excludes a contribution from light diffracted from the edges of the patterns, the "$0^{th}$ order" of diffraction, which would propagate in the same direction as the reflected light. This is expected to be very small. In the Kirchhoff scalar diffraction theory, the diffraction amplitude is multiplied by an inclination factor $(1+\cos\theta)$, where $\theta$ is the angle between the diffracted wave and the forward direction. This is described in Section 8.3.2 of M. Born and E. Wolf, Principles of Optics, $5^{th}$ edition, 1975, which is hereby incorporated by reference for all purposes. In the backward direction $\theta=\pi$, and the inclination factor is zero, so no $0^{th}$ order light would be expected. In diffraction from structures smaller than the wavelength of the illuminating light, polarization effects become important, and a vector diffraction theory is required. It is not known if a contribution from $0^{th}$ order diffraction is then possible.

The detector at the interferometer can't follow the very high instantaneous frequency of the laser light. Thus the detector output signal I will look like $$I = <|E(t)|^2> = Er^2 + Eabs^2 + Eml^2 + 2EabsEml\cos(\delta a - \delta ml - 4\pi/\lambda d) + 2ErEabs\cos(\delta r - \delta a - 4\pi/\lambda(z-d)) + 2ErEml\cos(\delta r - \delta ml - 4\pi/\lambda z), \quad (2)$$

where < > denotes a time average over the periodicity of the laser light. The first four terms are independent of z and will not directly affect the height determination. Eabs and Eml will vary somewhat as the reticle pattern illuminated by the laser beam varies, and the relative amount of exposed multilayer varies. We will examine that effect below. We will also deal with the constant representing the first four terms as well.

Subtracting off the constant terms gives a total z dependent interferometer signal $$Itotal(z) = 2ErEabs\cos(\delta r - \delta a - 4\pi/\lambda(z-d)) + 2ErEml\cos(\delta r - \delta ml - 4\pi/\lambda z). \quad (3)$$

Figure 12:
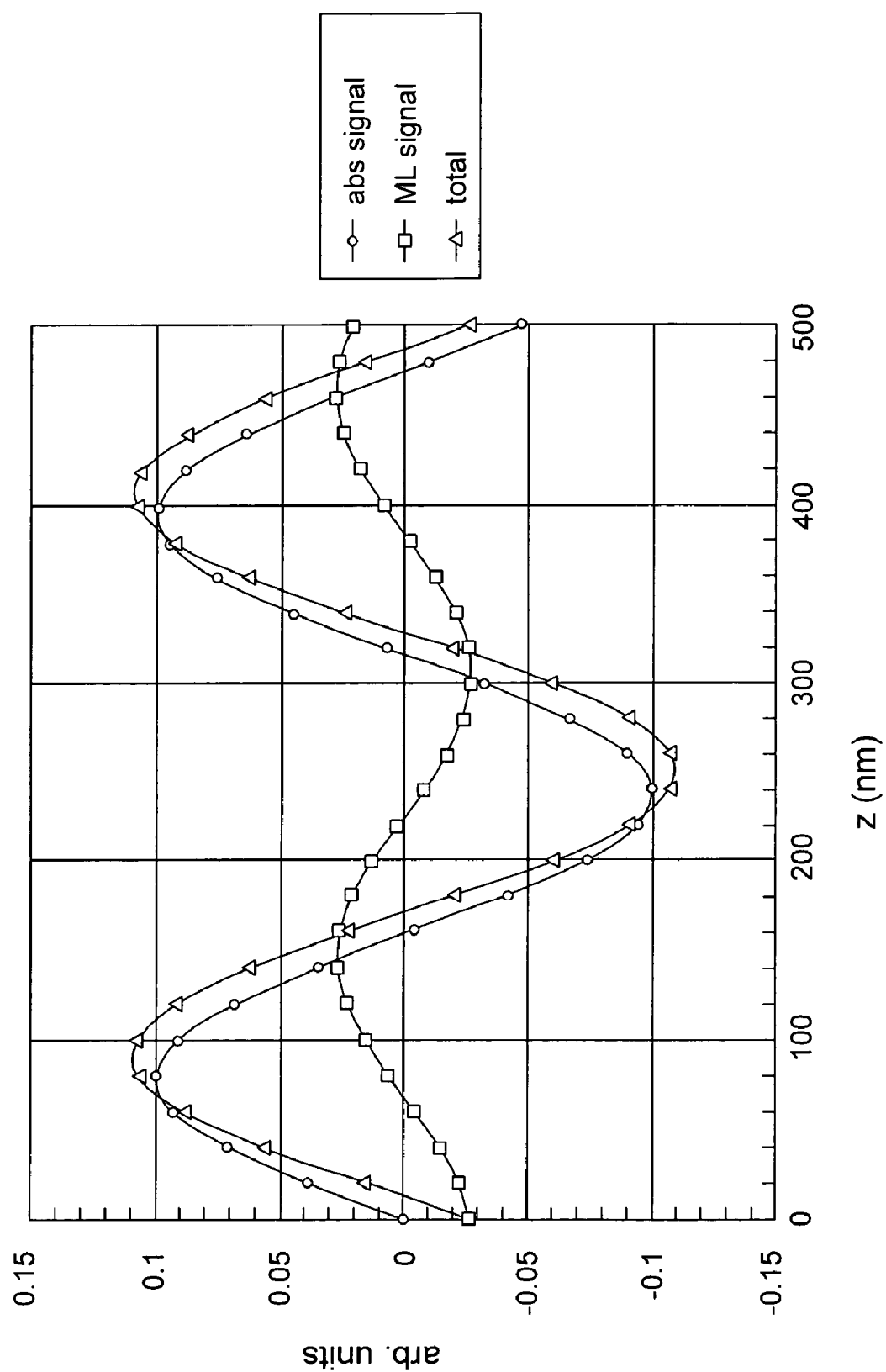
FIG. 12 illustrates some typical interferometer signals expected according to the present invention.

FIG. 12 gives an example of the interferometer signals as a function of z. A HeNe laser wavelength of 633 nm was assumed. In this example $\delta r = \delta a = 0$, and $\delta ml = \pi$. Note that the signals have a periodicity of $\lambda/2 = 316.5$ nm in z, because the total light path increases by 2z if the reticle is displaced a distance z. What is actually observed is the total signal. For these conditions, there is a substantial phase difference between the multilayer component and the total signal. The phase difference between the total signal and the absorber component is considerably smaller. For these conditions, determining the absorber height and adding the absorber thickness d to obtain the multilayer height would be more accurate than trying to determine the multilayer height directly. If the multilayer signal is small enough, the phase of the total signal will be close enough to the phase of the absorber signal that it can be used to determine z. Alternatively, if the absorber signal is much smaller than the multilayer signal, the height of the surface of the multilayer may be obtained directly from the interferometer signal.

Figure 13C:
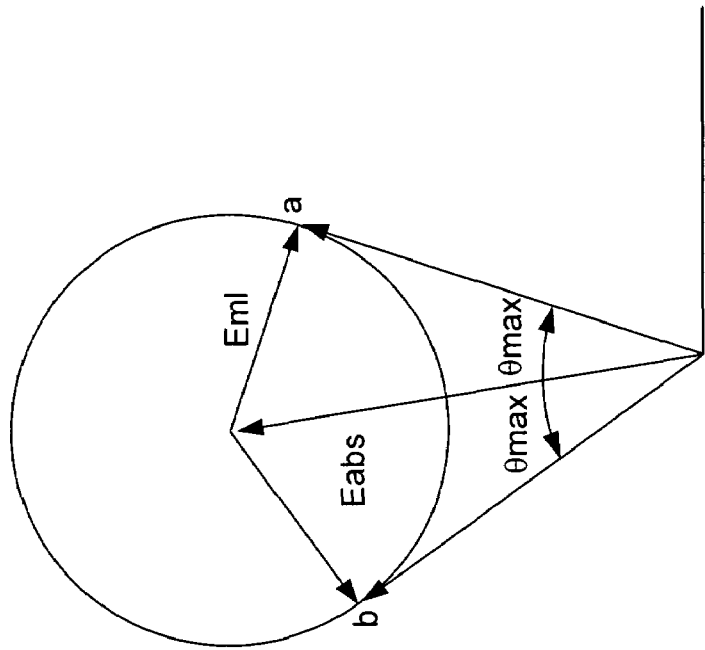
FIG. 13c is a phasor relation describing the maximum phase errors between the total interferometer signal and the contribution from the absorber.
Figure 13B:
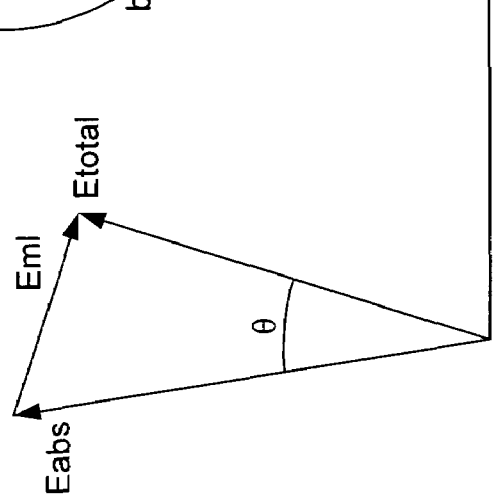
Figure 13A:
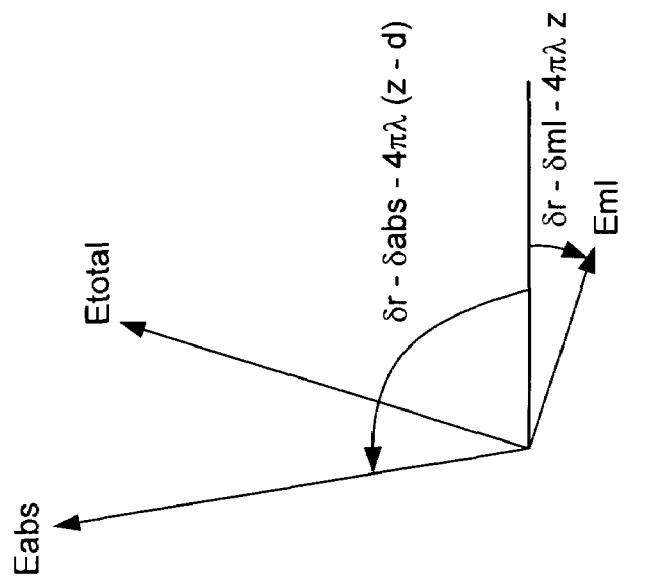
FIG. 13a shows a phasor diagram relating contributions to the interferometer signal by reflections from the reticle absorber and multilayer according to the present invention.

The accuracy of this determination can be estimated as follows. FIG. 13a is a phasor plot of the three terms in Eq. 2, and is equivalent to the information in FIG. 1. The vectors Eml and Eabs add vectorialy to produce Etotal, and the vectors rotate about the origin as z changes. FIG. 13b presents the same information in an equivalent form. If the phase of the measured interferometer signal, associated with Etotal, is used to approximate the phase of the absorber signal, a phase error of $\theta$ occurs, as shown in FIG. 13b. If we know nothing about the phase of Eml, the vector Eml could lie anywhere on the circle shown in FIG. 13c. The maximum phase error between Etotal and Eabs, $\theta max$, occurs when Eml is at either position a or b in the figure. The maximum error in height z of the absorber surface can then be shown to be equal to $$\Delta z max = \lambda/4\pi \arcsin(Eml/Eabs). \quad (4)$$

Figure 14:
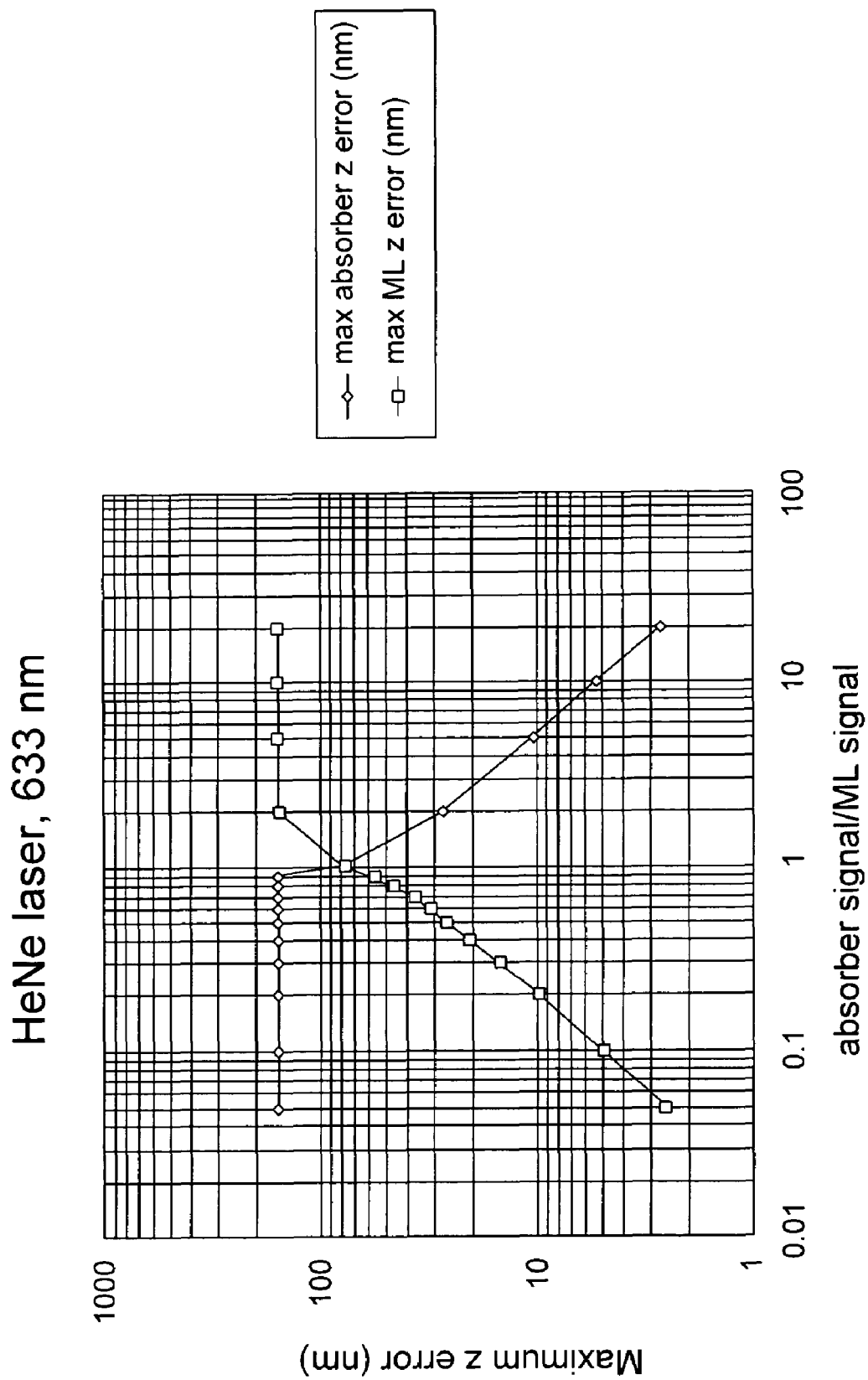
FIG. 14 shows the maximum error in reticle height associated with the total interferometer signal as a function of the relative magnitude of the signals from the absorber and multilayer according to the present invention.

The maximum error in z is plotted in FIG. 14 as a function of the ratio Eabs/Eml. Because of the periodicity of the interferometer signal, the maximum error shown is equal to $\lambda/4=158.25$ nm. This assumes that the height is known to within one half wavelength initially, an assumption based on the initial calibration process.

For a sufficiently large value of Eabs/Eml, the maximum error involved in equating Eabs to Etotal can be small. For Eabs/Eml>10, the error is less than about 10 nm, which may be acceptable for the present application. The height of the multilayer is then obtained by adding the thickness of the absorber layer d to the height determination. Alternatively, if the multilayer signal dominates the absorber layer signal, the multilayer height can be determined directly. For Eabs/Eml<0.1, the maximum height error of the multilayer is about 10 nm or less.

In between these values of the ratio Eabs/Eml, the error in z is larger, and a correction is needed. This is possible, because information about the reflection properties of the reticle is available. The reason for this is basically that a reticle requires extensive metrology and inspection to insure its quality. As a result, information about the reflectivity, the reflection phase changes $\delta abs$ and $\delta ml$, and the absorber thickness d exist, and with these the correct phasor relation shown in FIG. 13b can be constructed. This is described below.

Figure 15:
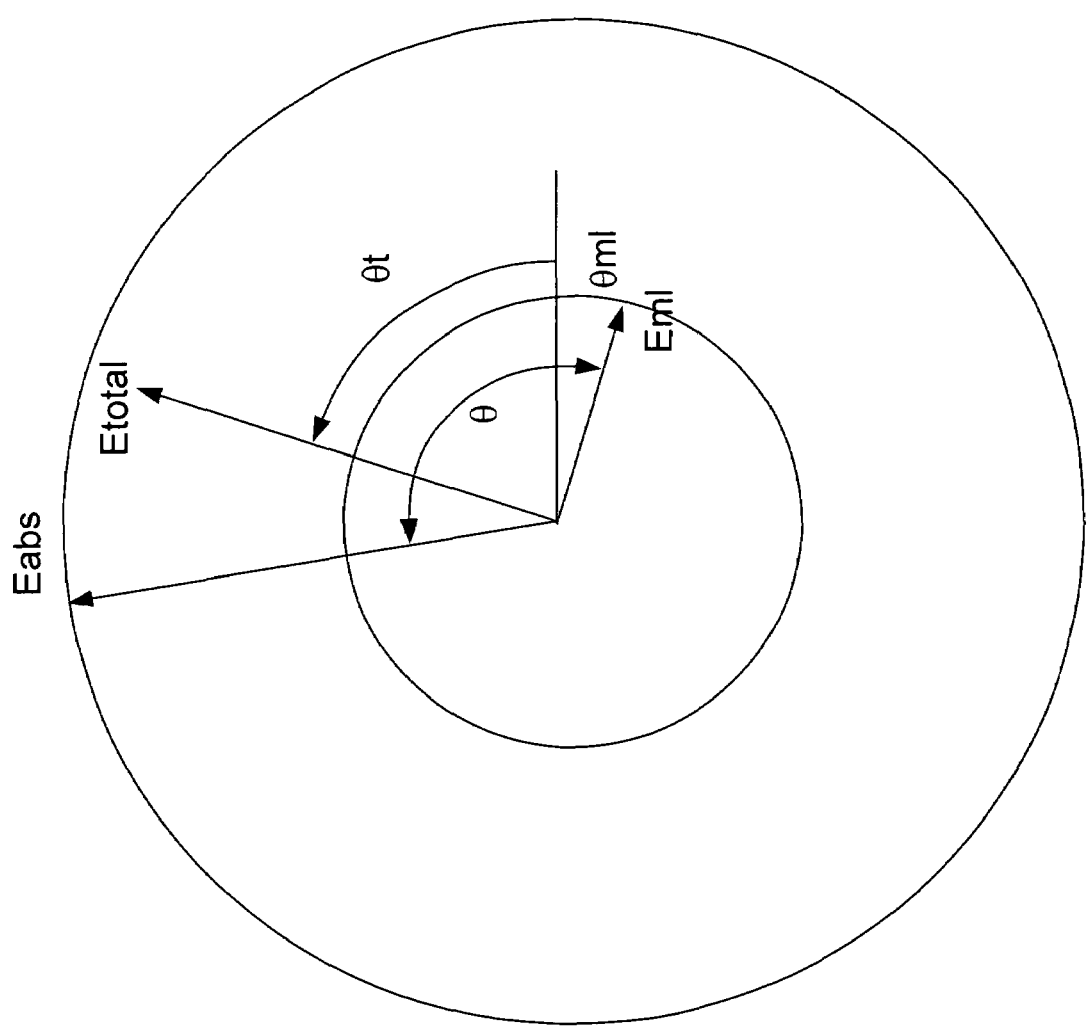
FIG. 15 shows a phasor diagram which relates the phases of the multilayer signal to that of the total interferometer signal.

FIG. 15 shows the same phasor relationship as in FIG. 14. As the three vectors rotate around the origin, the angles $\theta ml$ and $\theta t$ of the multilayer signal and the interferometer signal respectively, change continuously. The angle $\Theta$ between Eabs and Eml however remains constant:

$$\Theta = \delta ml - \delta abs + 4\pi d/\lambda. \quad (5)$$

The angle $\theta ml = \delta r - \delta ml - 4\pi z/\lambda$, so if $\theta ml$, $\delta r$ and $\delta ml$ are known, the height z can be determined. The interferometer signal Et and its phase $\theta t$ are measured directly. The absorber and multilayer signals must be inferred from the measured properties of the mask: the reflectivities of the absorber and multilayer, the reflection phase changes $\delta abs$ and $\delta ml$, and the absorber thickness d. The latter three quantities define the fixed angle $\Theta$ as shown in Eq. 5. The reflectivities define the ratio of the magnitudes of the absorber and multilayer signals.

From FIG. 15 an expression for the angle $\theta ml$ in terms of known quantities can be obtained from trigonometry:

$$\sin\theta ml = -\frac{at\sin\Theta\cos\theta t}{1+a^2+2a\cos\Theta} \pm \left[\left(\frac{at\sin\Theta\cos\theta t}{1+a^2+2a\cos\Theta}\right)^2 - \frac{t^2\cos^2\theta t - (1+a\cos\Theta)^2}{1+a^2+2a\cos\Theta}\right]^{1/2}, \quad (6)$$

where a=Eabs/Eml and t=Et/Eml; t can be shown to be equal to $$t=Et/Eml=[1+a^2+2a\cos\Theta]^{1/2}. \quad (7)$$

The phase $\theta t$ increases steadily with z, but $\sin\theta ml$ and $\cos\theta t$ are periodic, so care must be taken to correct for the periodicity, so that $\theta ml$ also increases with $\theta t$. The sign in front of the square root in Eq. 6 is chosen based on whether $\sin\theta t$ is in the first two quadrants (0-$\pi$) or the second two ($\pi$-2$\pi$), or more generally:

sign=+ if $2n\pi<\theta t\leq(2n+1)\pi$
sign=− if $(2n+1)\pi\leq\theta t<2(n+1)\pi$, for any integer n.

Eqs. 5, 6 and 7 allow the multilayer height to be determined in terms of the reflectivities of the absorber and multilayer, the reflection phase changes $\delta absl$ and $\delta ml$, and the absorber thickness d. The reflectivity of the absorber is defined as the fraction of incident laser light reflected by the absorber and detected by the interferometer detector. The reflectivity of the multilayer is defined similarly. Thus the reflectivity will depend on the fraction of absorber or multilayer in the illuminated part of the reticle in addition to the intrinsic reflectance of the surface, i.e. it will be pattern dependent. It will also depend on the fraction of reflected light which is reflected back through the pinhole aperture, which will again be pattern dependent. These quantities can be determined using calibration of sample patterns, as well as making use of the pattern database which defines the reticle pattern.

Figure 16:
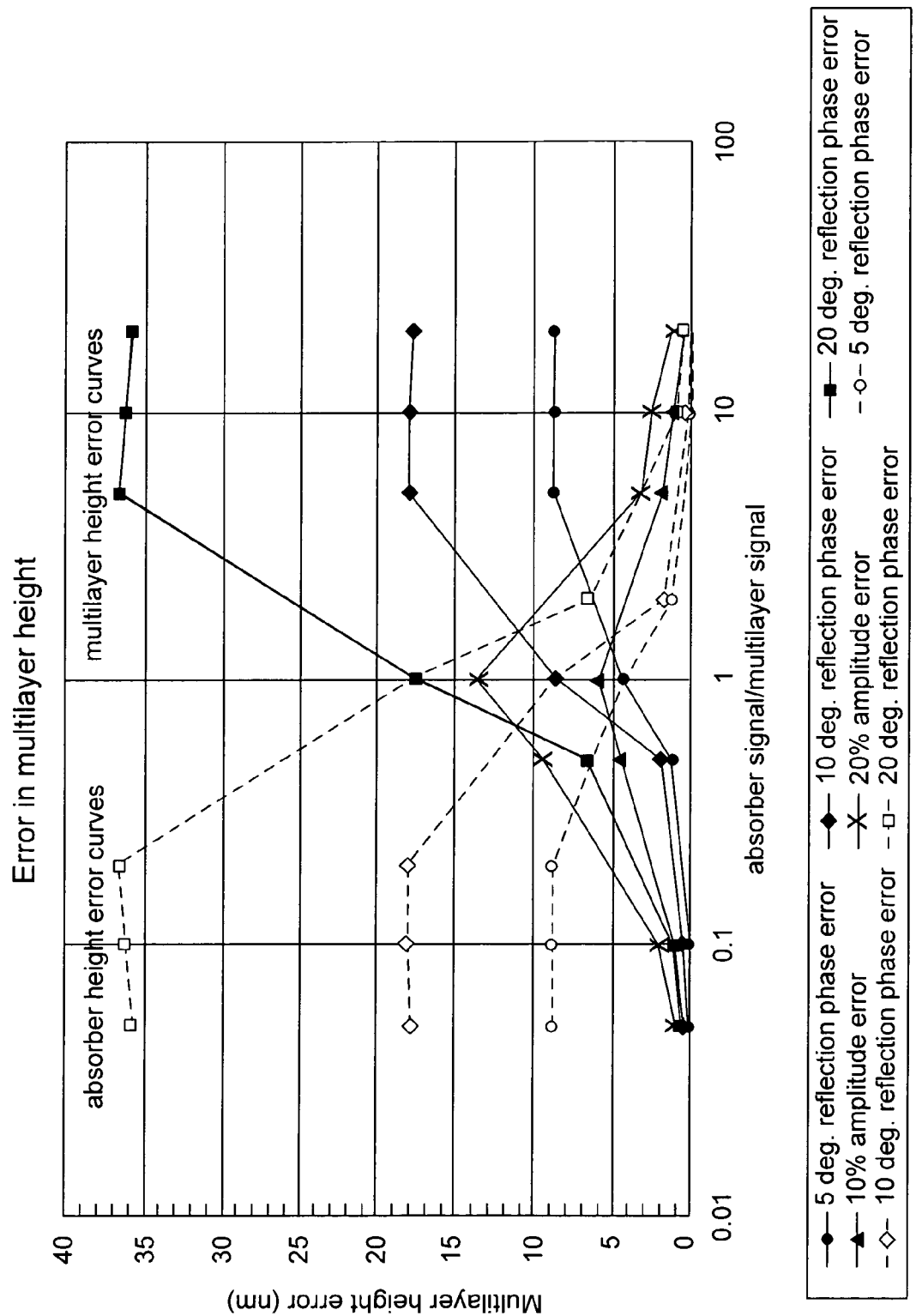
FIG. 16 relates the error in reticle multilayer height to uncertainties in the reflectivity or reflection phase at the absorber and multilayer surfaces according to the present invention.

Some residual error will remain however, for both the reflectivities and the reflection phase changes. Using Eqs. 5, 6 and 7, errors in z can be estimated from errors in the measured quantities. Results are shown in FIG. 16. Unless the absorber and multilayer signals are almost the same intensity, errors in amplitude of even 20% contribute errors of less than 10 nm to the height of the multilayer. Provided the absorber reflectivity is less than approximately 0.7 that of the multilayer, errors in the reflection phase change of as much as 20 degrees lead to multilayer height errors of less than 10 nm. If the absorber reflectivity exceeds that of the multilayer, then as mentioned above the height of the absorber can be determined and the multilayer height inferred from the known thickness of the absorber layer. In conclusion, the map of reticle reflection and reflection phase properties does not have to be very accurate in order to provide accurate values for the reticle height.

Figure 3:
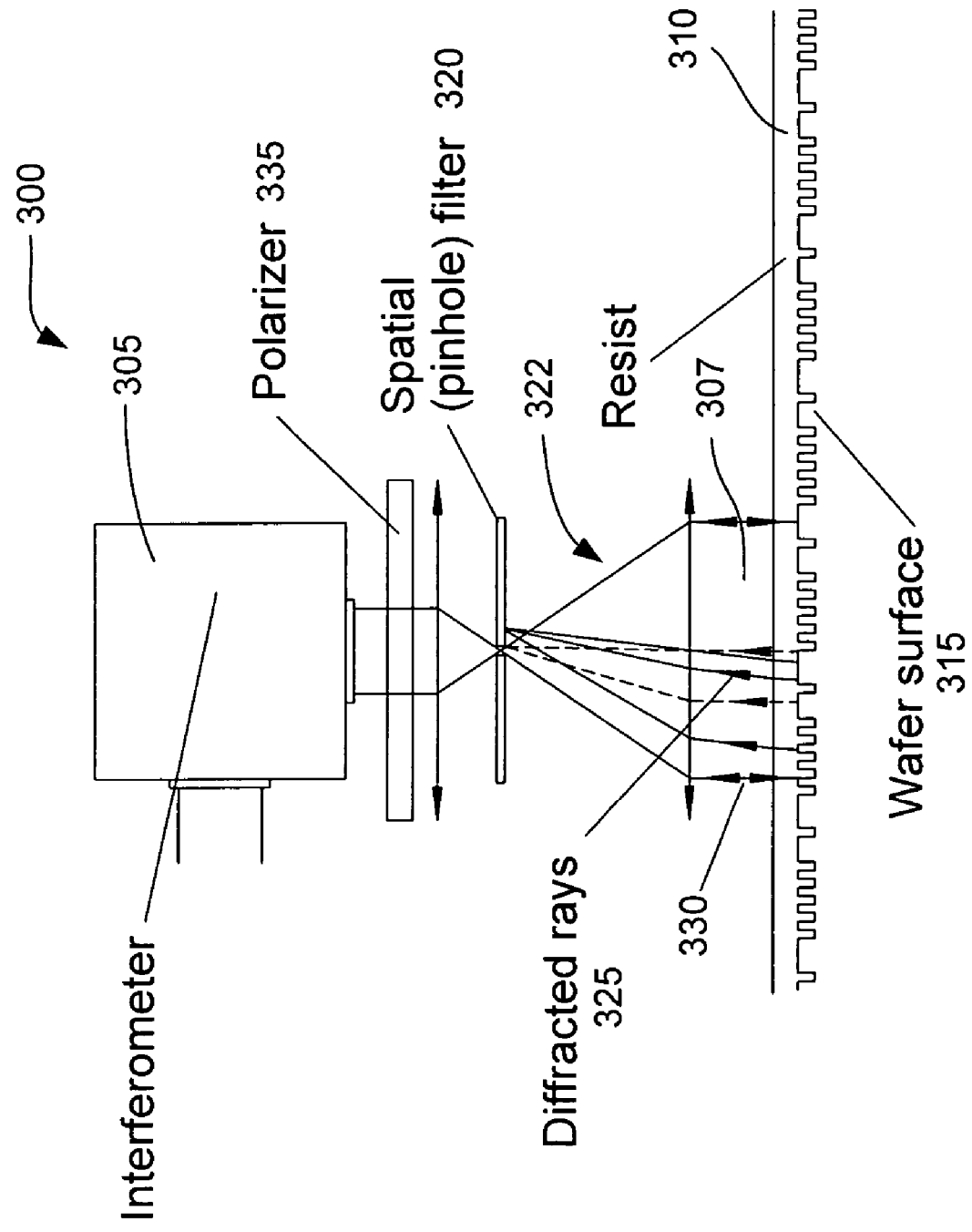
FIG. 3 illustrates an alternative embodiment of an AF device according to the present invention.

FIG. 3 illustrates AF system 300 for measuring a distance to a wafer surface. This embodiment may be used in non-telecentric lithography systems, such as the EUV lithography system described above with reference to FIG. 1. However, AF system 300 may be generally more useful for telecentric lithography systems such as those described below.

AF system 300 is designed to determine the position of the top surface of photoresist 310. Here, the reflected signal 330 is primarily coming from photoresist 310 and the diffracted and scattered rays 325 are primarily coming from wafer surface 315. In addition the reflected light signal and the reflection phase from the photoresist surface should be essentially constant, whereas the signals originating at the wafer surface will vary with the wafer pattern details. AF device 300 includes spatial filter 320 for isolating reflected signal 330. Filter 320 blocks scattered rays and higher-order diffracted rays 325.

In EUV applications, many of the features patterned on wafer 315 will be much smaller than the wavelength of light used for AF beam 322. Therefore, scattering and large angle diffraction should be significant. For lithography systems using longer-wavelength exposure radiation, this effect should be less significant. However, a longer wavelength can be chosen for the interferometer, if greater large angle scattering and diffraction is desired.

As above, optional polarizer 335 will help to attenuate the scattered and diffracted light received by interferometer 305. Accordingly, the reflected light from photoresist 310 should be relatively easy to isolate in this example. In addition, if a map of the wafer reflection and reflection phase is prepared, as described above for the reticle, Eqs. 5, 6, and 7 may be employed to provide further correction to the height determination. Therefore, the distance to the photoresist surface may readily be determined and this distance may be adjusted, if necessary.

Figure 4:
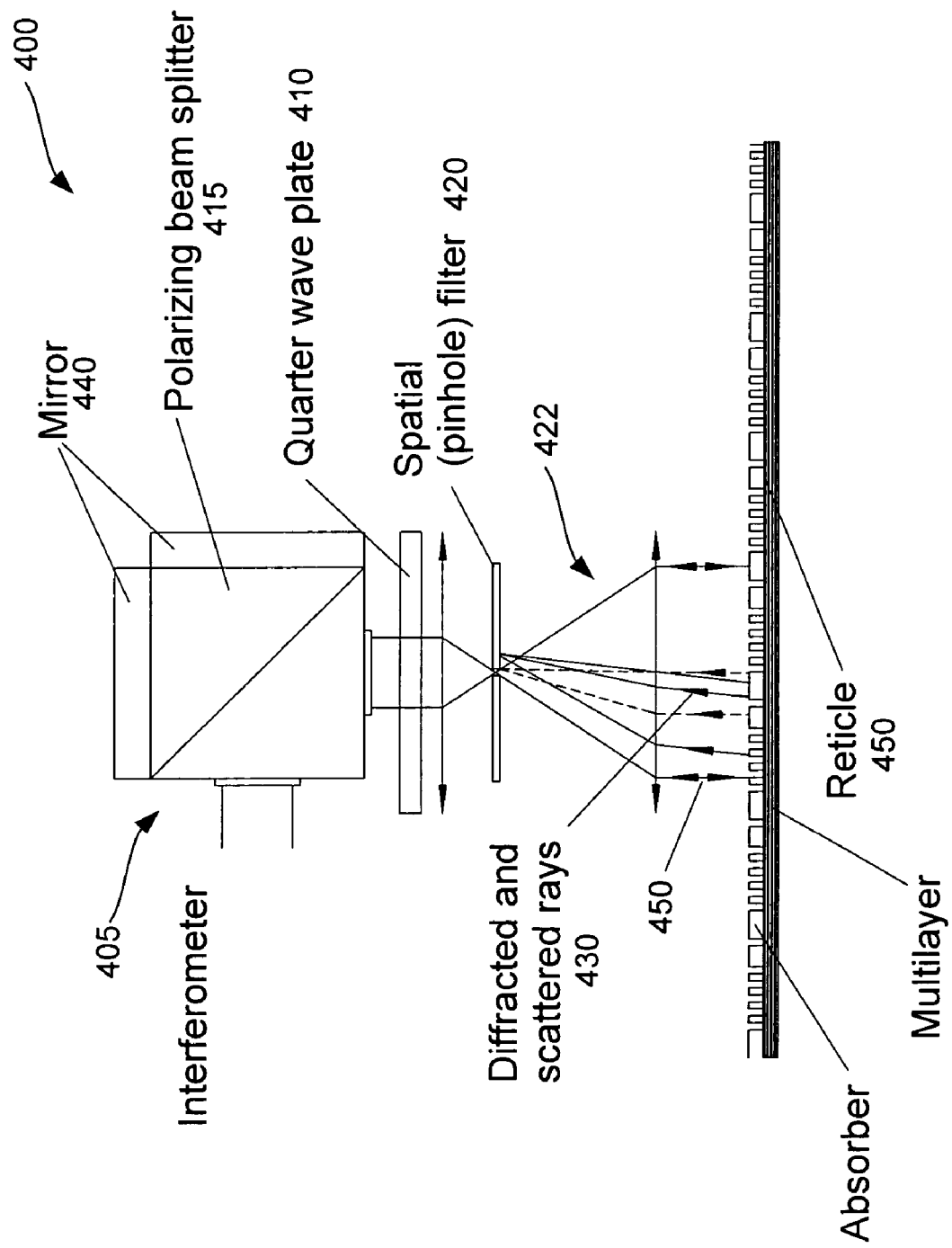
FIG. 4 illustrates another embodiment of an AF device according to the present invention.

Additional improvements to the previously-described AF systems are shown in FIG. 4. AF system 400 includes polarizing beam splitter 415 and quarter wave plate 410. These optical elements require at least a portion of AF beam 422 to make two round trip passes to and from the target (in this example, reticle 450). Encountering the target twice doubles the probability of scattering or diffraction from the multilayer or the wafer surface. It also increases the likelihood that diffracted or scattered light that may have a small enough angle to make it through the pinhole a first time will be stopped from making it through the pinhole a second time. Other embodiments of the invention include similar devices for further increasing the number of round trip passes of AF beam 422.

Figure 5:
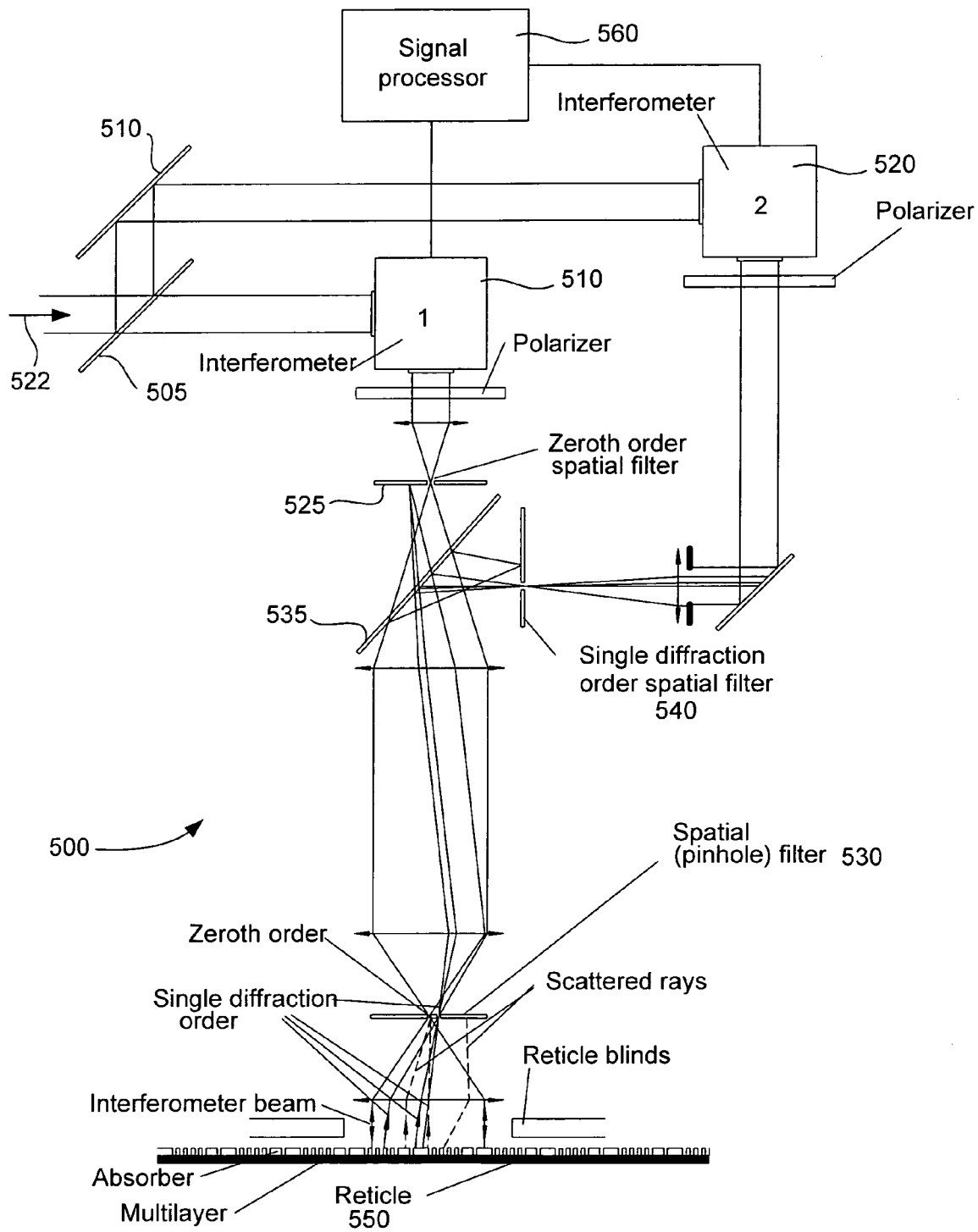
FIG. 5 illustrates still another embodiment of an AF device according to the present invention.

Moreover, in the embodiments described above, the signal received from the target by the interferometer(s) may include a small contribution from the $0^{th}$ order of light diffracted from the edges of patterns. FIG. 5 illustrates an embodiment that corrects for contributions from the $0^{th}$ order by isolating a single order of diffracted light from the reticle. Here, input AF beam 522 is split by beam splitter 505. A first part of AF beam 522 is directed to interferometer 510 and a second part of AF beam 522 is directed to interferometer 520.

AF system 500 includes spatial filters 525, 530 and 540. A partially reflecting beam splitter 535 directs light to interferometers 510 and 520. Spatial filter 525 is a pinhole filter such as those previously described, which passes reflected light to interferometer 510. Spatial filter 530 includes a pinhole and a slit. The pinhole transmits reflected light, and the slit passes an order of diffracted light (e.g., $1^{st}$-order diffracted light). Spatial filter 540 passes only the selected order of diffracted light to interferometer 520. The resulting signals are processed by signal processor 560 to obtain the height of a selected part of reticle 550.

AF system 500 has several potential advantages. A better measurement of the multilayer surface may be obtained, because light reflected from the absorber surface can be eliminated. Alternatively, this resulting signal may be used to estimate the amount of zero order diffracted light received by interferometer 510 and correct for it. A relation between the $0^{th}$ diffraction order and the selected diffraction order is needed. This must be determined from diffraction theory and some calibration from known patterns. The signal processing is preferably pattern-dependent, based on empirical data.

If an interferometer is used to measure the height of a reticle or a wafer, even if there is no ambiguity about where the reflection is coming from, there is still ambiguity about the absolute height. Without additional input or calibration, an interferometer can determine differences in height but not absolute height. The interferometer signal repeats itself every half-wavelength. Accordingly, one needs to obtain a calibration for a known height. An interferometer system can then measure changes from that height.

Figure 6A:
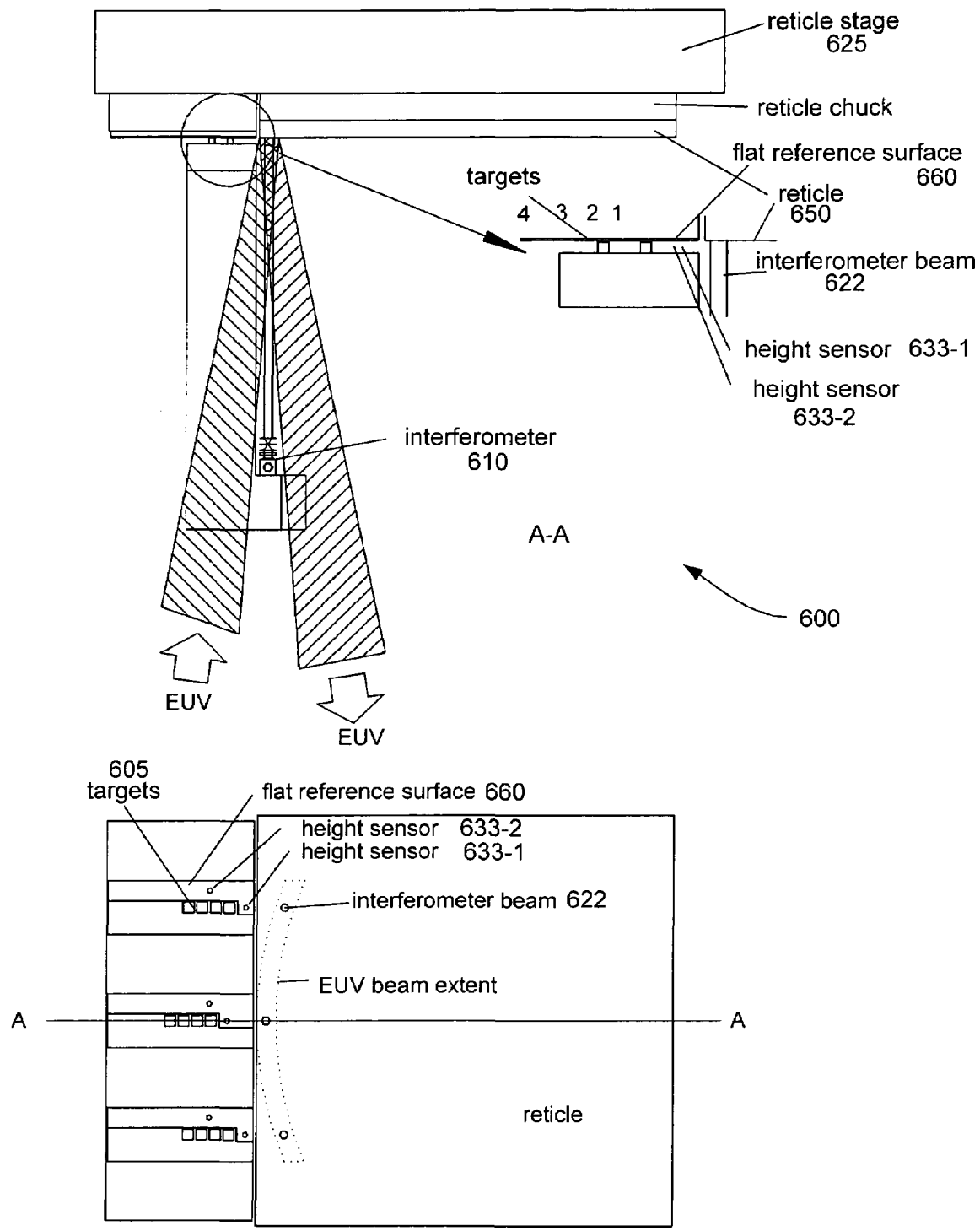
FIG. 6A illustrates an AF device having a calibration system according to the present invention.

FIG. 6A illustrates the AF system 600, which includes an exemplary means of calibration. In AF system 600, several interferometer beams 622 measure the height of reticle 650 simultaneously. The interferometer signals are initially calibrated to the absolute reticle height. This calibration is performed by comparing the interferometer reticle height measurement to that measured by height sensors 633-1 and 633-2, which may be capacitance sensors. In this example, height sensors 633-1 and 633-2 are rigidly mounted to the same base as interferometer 610. The reticle height is compared to the height of reference flats 660, which in this example are mounted on reticle stage 625, the height of which has been previously calibrated.

The targets 605 represent different, previously calibrated surfaces with different properties. For example one of targets 605 can have the composition of a multilayer that is to be used in patterning a wafer. Another of targets 605 may have the composition of an absorber layer without patterning. Still other targets 605 may be formed with representative patterns such as contacts, L/S arrays, gates, etc. As the interferometer beams 622 measure the heights and properties of the targets, the capacitance sensors 633 simultaneously monitor the stage height, to ensure that the height does not change during translation.

Figure 6B:
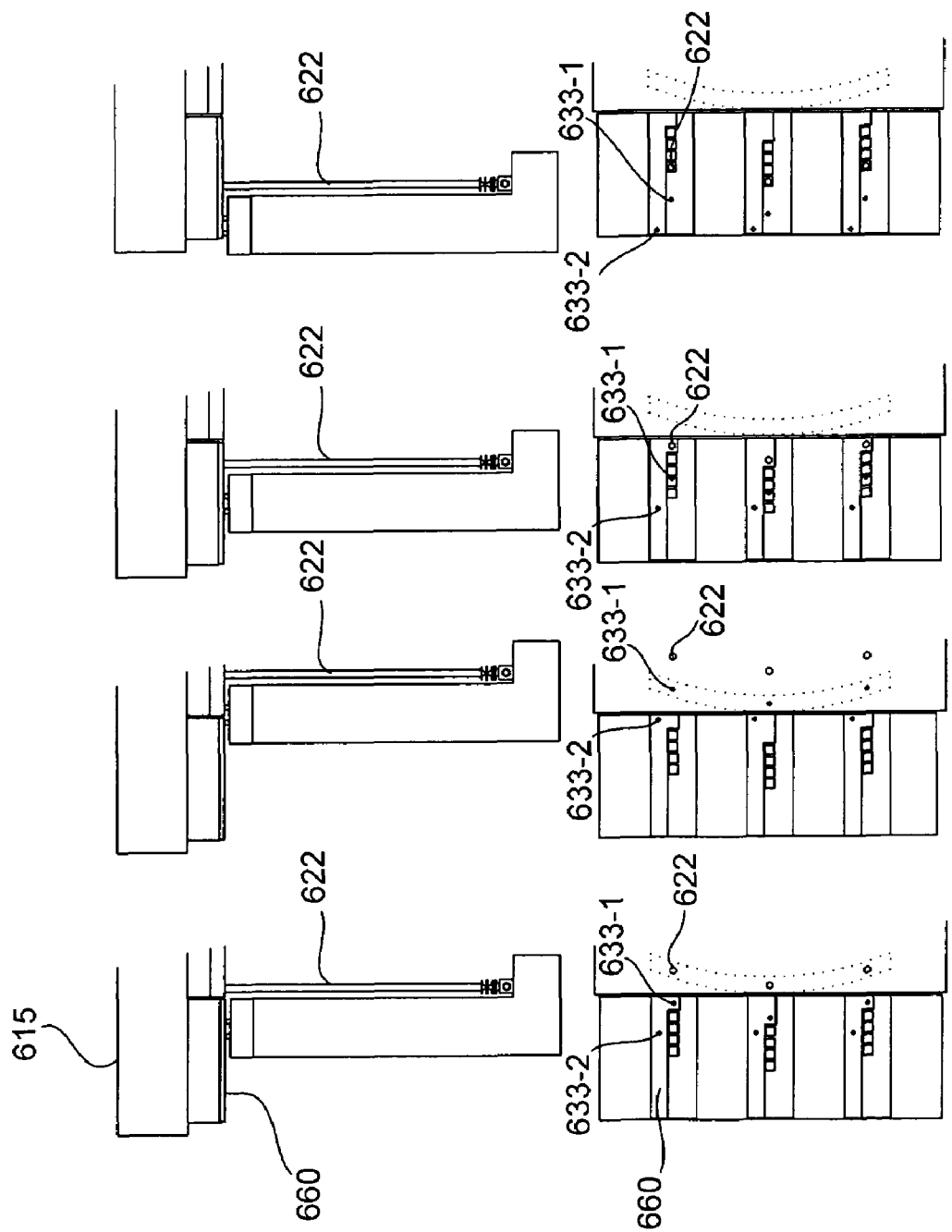
FIG. 6B illustrates the calibration procedure of the AF device shown in FIG. 6A.

One exemplary calibration procedure is described in more detail here with reference to FIGS. 6A and 6B. A reference flat 660 is rigidly attached to the reticle mounting system on the reticle stage 625 and is located in approximately the same horizontal plane as the reticle surface. The reference flat surface 660 height is measured by height sensors 633-1 and 633-2, which may be capacitance sensors. After the reticle is loaded, the reticle stage 625 is moved to position a, and the reticle stage height is adjusted to a standard value equal to that of the focal plane at the reticle 650, based on measurements by height sensors 633-1 and 633-2. The signals from the interferometers 610 are also recorded. The signals from the height sensors and the interferometers go to a reticle height measuring system and to the reticle stage controller.

Figure 6C:
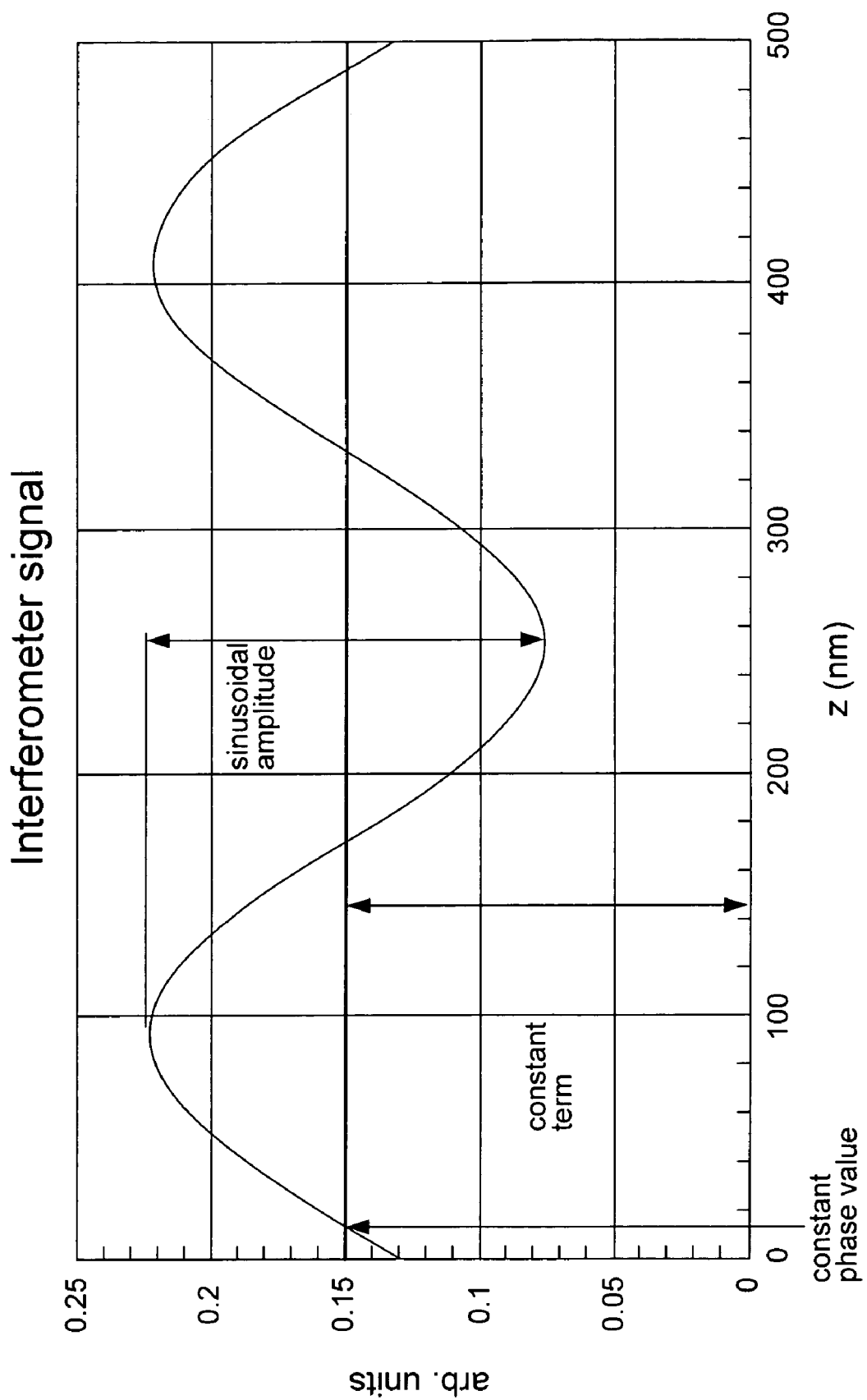
FIG. 6C illustrates the interferometer signal properties obtained during the calibration process.

The stage is then moved to position b, using signals from height sensors 633-2 sent to the reticle stage controller to maintain the reticle stage 625 at a constant height. The reticle surface height is determined using height sensors 633-1 and the differences between the reticle height and the reference flats 660 determined. The reticle stage 625 is then moved to position c, using signals from height sensors 633-2 to maintain the reticle stage 625 at a constant height. The interferometers 610 measure the height of the reference flat. Then the reticle stage height is adjusted, so that the periodicity of the interferometer signal is recorded. This allows the total constant term in Eq. 2 to be determined, as well as the amplitude of the sinusoidal term, as illustrated in FIG. 6C. For convenience the sinusoidal contribution shown in Eq. 3 may be condensed to a single term, using trigonometric identities:

$$I\text{total}=[A^2+B^2]^{1/2} \cos \{4\pi z/\lambda+(\delta_1+\delta_2)/2+\Phi\}, \quad (8)$$

where
$A=(a+b)\cos((\delta_1-\delta_2)/2)$,
$B=(a-b)\sin((\delta_1-\delta_2)/2)$,
$a=2ErEabs$,
$b=2ErEml$,
$\Phi=\arctan(B/A)$,
$\delta_1=\delta a-\delta r-4\pi d/\lambda$,
$\delta_2=\delta ml-\delta r$.

The amplitude Er is constant and may be measured offline. Since the interferometer will only be used to measure height changes, the phase δr may be set equal to zero. The other quantities in Eq. 8 are known from reticle inspection data.

As described above, the constant terms in the interferometer signal defined in Eq. 2 will vary with the reticle pattern, as will the sinusoidal terms. The variation can be predicted from the known reflectance of the absorber and multilayers and the relative amount of absorber and exposed multilayer surfaces in the reticle pattern illuminated by the interferometer, which has been predetermined. However the response of the interferometer detectors will depend somewhat on the basic pattern properties. The detector response is calibrated by the targets identified as 605-1 to 605-4 in FIG. 6A. However more or fewer targets 605 may be used. The target heights have been pre-measured and, the reticle stage height is maintained constant, using signals from height sensors 633-2, while the interferometers 610 illuminate the targets. In position d the interferometer beams 622 are shown measuring the height of target 605-4.

The reticle stage 625 is then returned to position a, and the reticle is adjusted to the height of the focal plane.

In FIG. 6A separate reference flats 660 are shown, one for each interferometer beam 622. However, a single large reference flat may be used for all the interferometers. The reference flat is ideally perfectly flat, but small deviations in height may be mapped offline. The height sensors may then be corrected for the height variations, since the position of the flat relative to the sensors is known from the reticle stage position metrology system. A height sensor 633-2 is shown for each interferometer beam. However the number of height sensors 633-2 and location may vary depending on the reticle stage servo and metrology systems.

The above calibration is based on specific values of the reflectivity of the absorber layer and multilayer and their associated phases. As the reticle stage moves the reticle relative to the interferometer beams, these values will change as the reticle pattern changes. Thus the calibration will change. The main changes are likely to be the reflectivities, which we have defined as the product of the reflection from one of the surfaces, multiplied by the fraction of the area of that surface illuminated by the interferometer beam. The phases, being associated with the material properties of the surfaces, are unlikely to change to any significant extent. Since the properties of the reticle must be well known both from its initial pattern design and from inspection of the fabricated reticle, the changes in calibration can be calculated, as described earlier.

Nevertheless, a separate measurement of the changes in the interferometer calibration is desirable. The error analysis given earlier shows the sinusoidal component of the interferometer height measurement is not very sensitive to the values of the reflectivity and phase. However, any error in the constant terms in Eq. 2 adds linearly to height measurement, so a separate measurement of the sum of the constant terms is desirable. This can be accomplished in several ways.

The basic interferometer signal, Eq. 2, can be written as $$I(t) = I_0 + I_1 \cos(4\pi z/\lambda + \Omega), \quad (9)$$

where $\Omega = (\delta_1 + \delta_2)/2 + \Phi$, from Eq. 8. This includes the phase $\delta r$ from the reference beam, which we set to zero above. However, if we change $\delta r$ by a fixed amount of phase by some means we can create the following set of signals:

$$I_{90}(t) = I_0 + I_1 \cos(4\pi z/\lambda + \Omega + \pi/2) = I_0 + I_1 \sin(4\pi z/\lambda + \Omega), \quad (10)$$

$$I_{180}(t) = I_0 + I_1 \cos(4\pi z/\lambda + \Omega + \pi) = I_0 - I_1 \cos(4\pi z/\lambda + \Omega), \quad (11)$$

where we have set $\delta r$ equal to $\pi/2$ and $\pi$. From these measured quantities, we can solve for the quantities in Eq. 9 which are varying with reticle position:

$$I_0 = (I(t) + I_{180}(t))/2, \quad (12)$$

$$I_1 = \tfrac{1}{2}[(I(t) - I_{180}(t))^2 + (2I_{90}(t) - I(t) - I_{180}(t))^2]^{1/2} \quad (13)$$

$$4\pi z/\lambda + \Omega = \arctan((2I_{90}(t) - I(t) - I_{180}(t))/(I(t) - I_{180}(t))). \quad (14)$$

This provides an independent means of calibrating the relative changes in the interferometer signal with reticle position. Note however that we still need to know the reflection phases $\delta a$ and $\delta ml$ (and the absorber thickness) in order to extract the reticle height from $\Omega$. Note also that if only the constant term 10 needs to be measured directly, only signals I(t) and $I_{180}(t)$ are needed.

Figure 17:
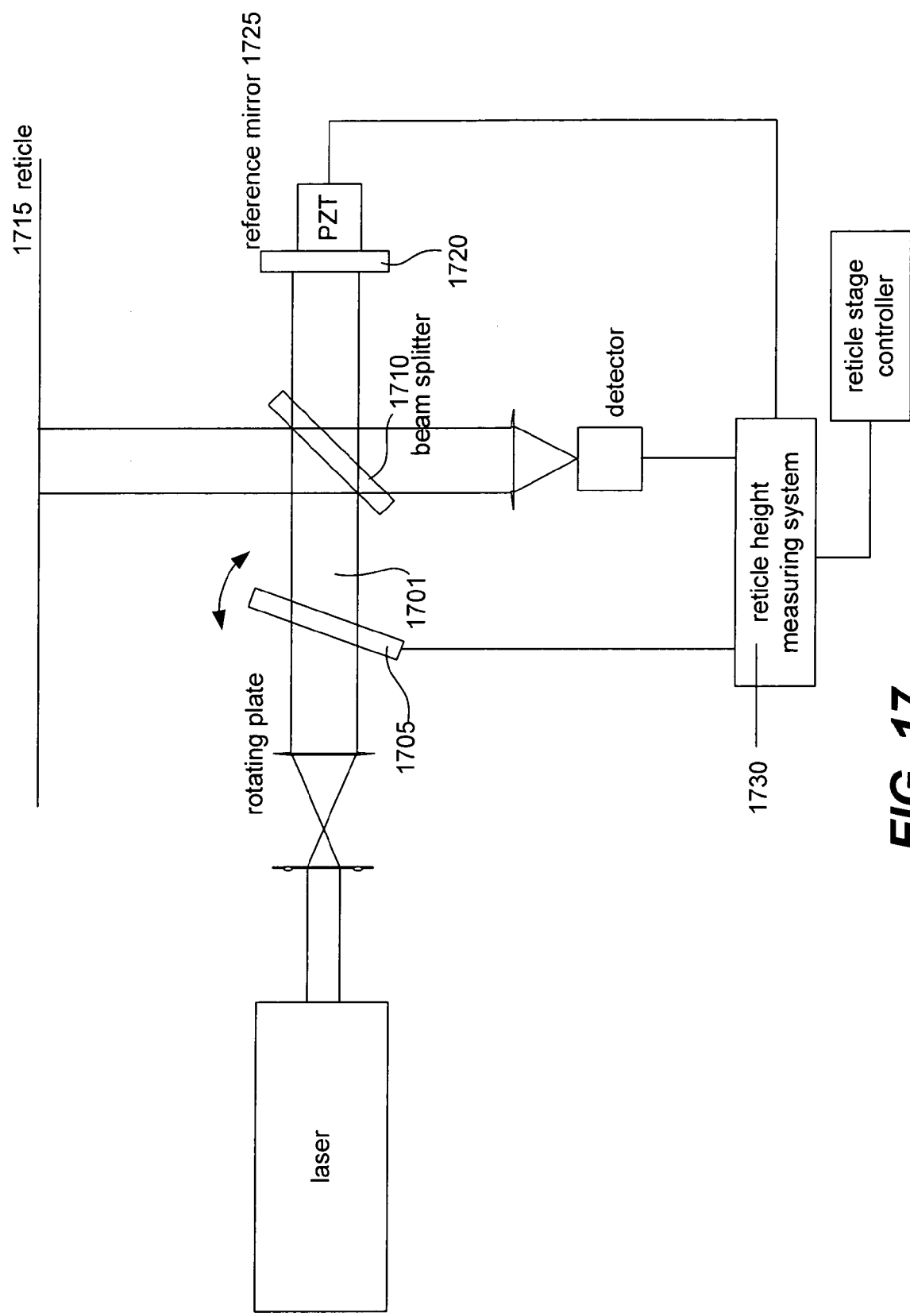
FIG. 17 illustrates an embodiment of the present invention, including a calibration system.

The necessary changes in the reference phase $\delta r$ can be accomplished in a number of ways. In FIG. 17 a transducer 1720, such as a piezoelectric transducer, moves the reference mirror 1725 by an amount equal to a round trip phase change of $\pi/2$ or $\pi$, under the control of the reticle height measuring system 1730. The stage is moving during this calibration procedure, so the reticle pattern illuminated by the interferometer is changing. However, changes to $I_0$ and $I_1$ are likely to be small if the mirror transducer and measurement times are short, or if the absorber and multilayer reflectivities change slowly with reticle position. The residual error can be removed by introducing a rotating transparent plate 1705 with parallel faces in the beam from the interferometer. The plate 1705 moves the beam 1701 to follow a fixed position on the reticle 1715 during the calibration. Plate 1705 rotates back between measurements. Since fabrication specifications require the reticle 1715 to be nearly flat, continuous monitoring of the reticle height is unnecessary, and periodic measurement of the reticle height should be acceptable.

Figure 18:
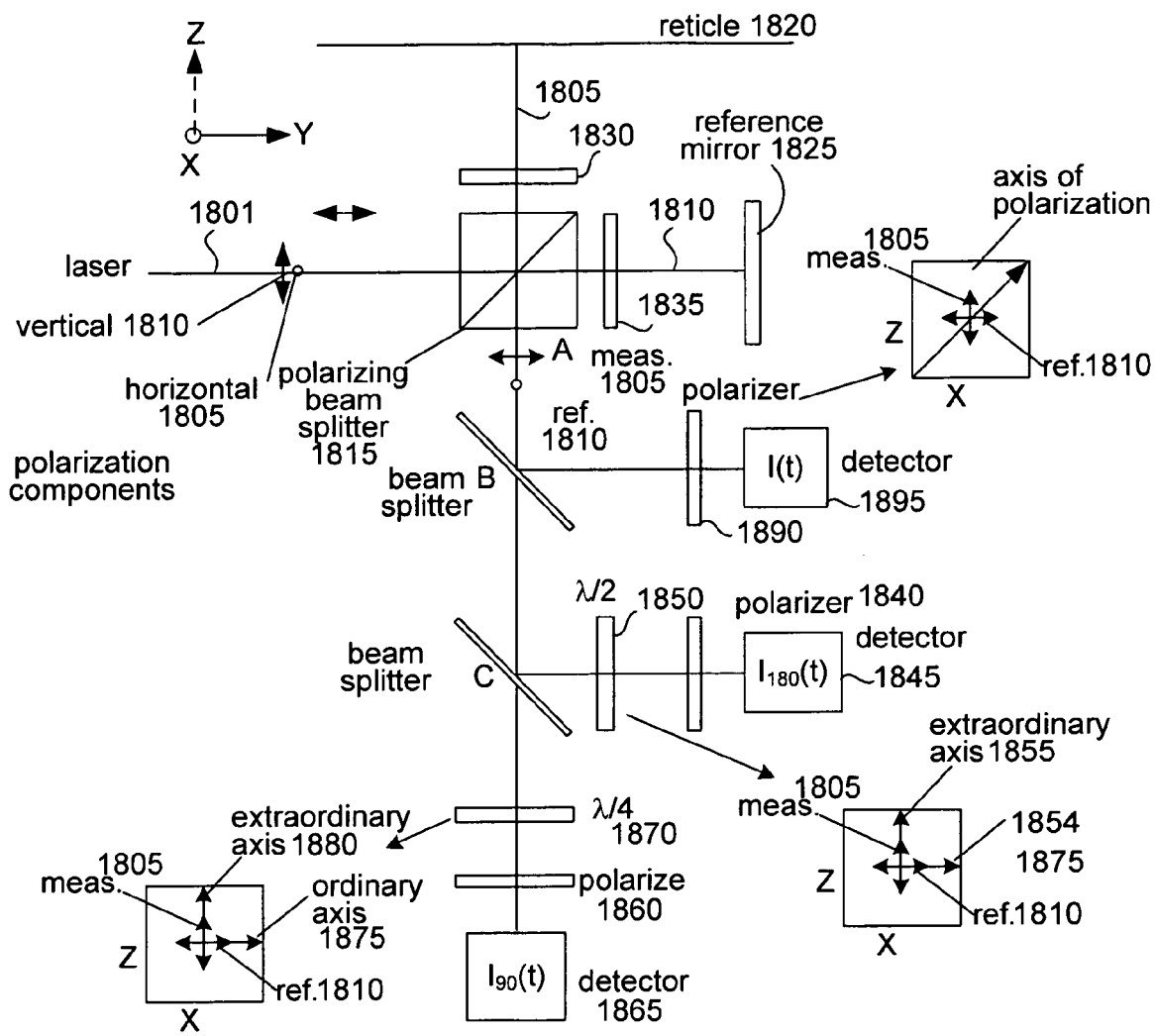
FIG. 18 illustrates an embodiment of the present invention, including another embodiment of a calibration system.

An alternative method of changing the reference phase, shown in FIG. 18, allows continuous monitoring of the reticle height if desired. The interferometer beam 1801, containing both horizontal component 1805 and vertical component 1810 of polarization, is incident on a polarizing beam splitter (PBS) 1815. The PBS 1815 separates the two polarization components, with the horizontal polarization component 1805 going to the reticle 1820 and the vertical component 1810 going to the reference mirror 1825. Both components pass twice through quarter wave plates 1830 and 1835, which rotate the polarizations by 90 degrees. This allows both components to emerge from the PBS 1815 at point A. A partial beam splitter B splits off ⅓ of the beam intensity, the two polarization components 1805 and 1810 are combined by means of a polarizer 1890 oriented at 45 degrees, and the now interfering beams enter the detector 1895. This produces signal I(t). The signal passing through beam splitter B is divided into equal intensities by beam splitter C. The component reflected by beam splitter C passes through a half wave plate 1850, which is oriented so that its ordinary ray axis 1854 is parallel to the polarization of the reference beam 1810, and its extraordinary axis 1855 is parallel to the polarization of the measurement beam 1805. This introduces an additional phase of $\pi$ into the reference beam 1810 relative to that of the measurement beam 1805. The two beams are then combined using a polarizer 1840 as above, and the interfering beams enter the detector 1845. This produces signal $I_{180}(t)$. The final component of the interferometer beams passes through the beam splitter C and then a quarter wave plate 1870, which is oriented so that its ordinary ray axis 1875 is parallel to the polarization of the reference beam 1810, and its extraordinary axis 1880 is parallel to the polarization of the measurement beam 1805. This introduces an additional phase of $\pi/2$ into the reference beam 1810 relative to that of the measurement beam 1805. The two beams are then combined with a polarizer 1860 as above and the interfering beams enter the detector 1865. This produces signal $I_{90}(t)$. Thus the three signals needed for the solution of Eqs. 12, 13 and 14 can be supplied simultaneously. Not shown in FIGS. 17 and 18 is a spatial filter, to eliminate or reduce contributions to the measurement beam from diffraction and scattering at the reticle.

Figure 19:
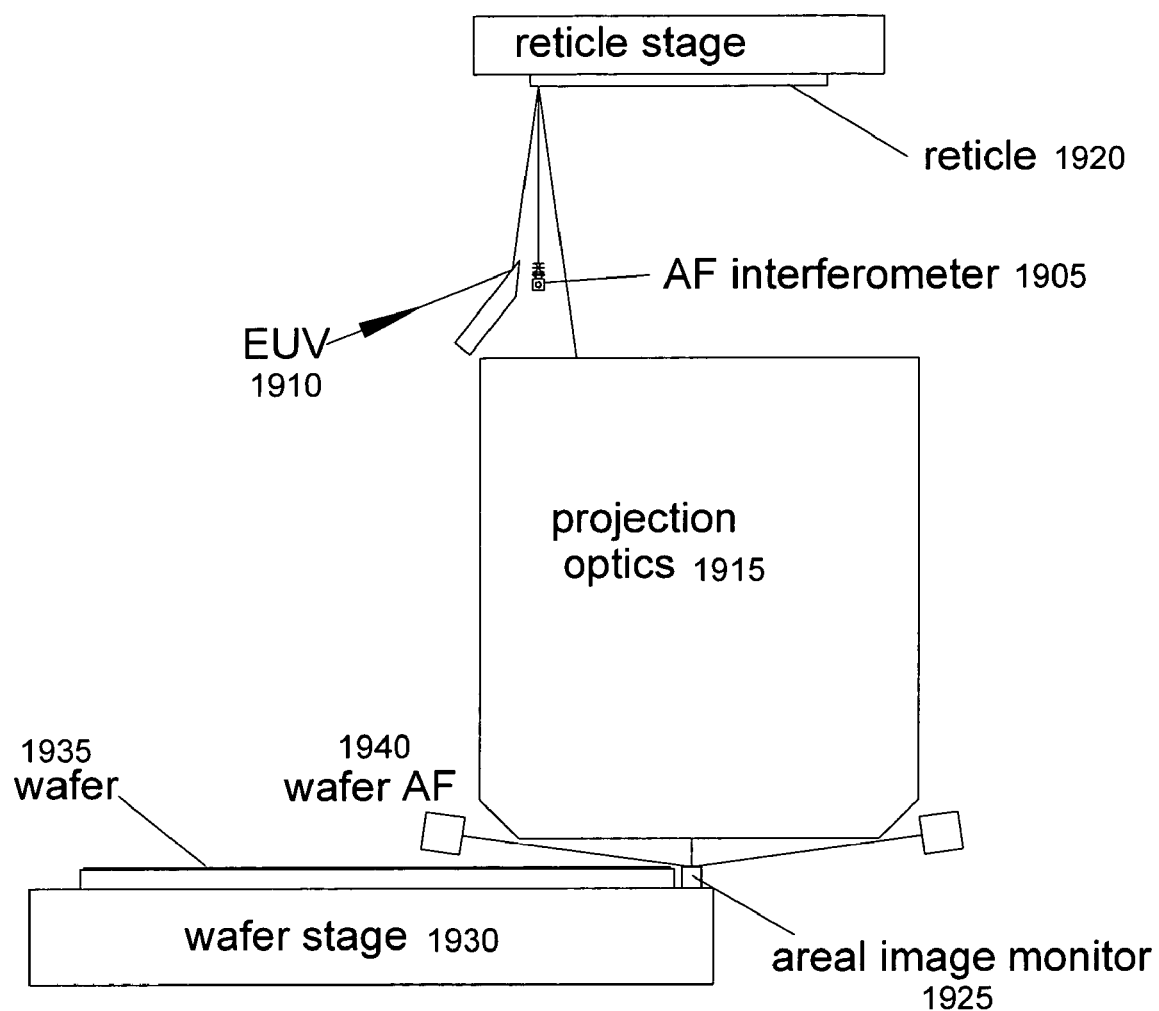
FIG. 19 illustrates an AF device having another calibration system according to the present invention.

In another embodiment, calibration of the AF interferometer 1905 utilizes the imaging of the EUV light 1910 by the projection optics 1915. This is illustrated in FIG. 19. A special pattern on the reticle 1920 is illuminated with EUV light 1910 from the illumination optics. The image of the pattern is detected by an areal image monitor (AIM) 1925, which is mounted on the wafer stage 1930. The areal image monitor 1925 measures the quality of the image in a specific horizontal plane defined by an aperture in the monitor. Thus the monitor can determine the plane of best focus of the optics for a given reticle height. When a wafer 1935 is loaded, the wafer height is measured by the wafer AF system 1940 and compared with the height of the AIM 1925, which has also been measured by the wafer AF system 1940. The wafer height is then adjusted to bring it to the plane of best focus.

The AIM 1925 is set to a predetermined height and illuminated with the image from the reticle alignment mark. The reticle height is then adjusted with the reticle stage until a best focus condition is recorded by the AIM 1925. The reticle AF interferometer signal is measured, and the absolute interferometer position has been calibrated. Moving the reticle 1920 up and down from that position allows the AF interferometer periodicity and amplitude to be measured as well.

The above description is based on the use of a single wavelength Twyman-Green interferometer to measure the reticle surface. However other interferometric means may also be used. For example, a Twyman-Green interferometer using two different wavelengths $\lambda_1$ and $\lambda_2$ provides a signal whose periodicity is equal to that of a signal from an interferometer with single wavelength $\Lambda$, $$\Lambda = \lambda_1 \lambda_2 / (\lambda_1 - \lambda_2),$$

where we assume $\lambda_1 > \lambda_2$. For example, if $\lambda_1 = 1.2\ \lambda_2$, then $\Lambda = 6\lambda_2$. $\Lambda$ can easily chosen large enough that ambiguities associated with the periodicity of the interferometer signal can be eliminated, thereby simplifying the calibration. Such interferometers are described in P. de Groot, Optical Engineering 40, 28(2001), which is hereby incorporated by reference for all purposes.

Another version of a two wavelength interferometer utilizes two nearby wavelengths from the HeNe laser which are circularly polarized in opposite directions. One beam serves as the measurement beam and the other as the reference beam. The resulting interferometric signal oscillates at the beat frequency associated with the two wavelengths, $c/\lambda_2 - c/\lambda_1$, where c is the speed of light. The advantage of this type of interferometer is that the signal is insensitive to variations in the beam intensity associated with low frequency laser noise. Such heterodyne interferometers are commercially available from Zygo Corp.

Examples of other distance measuring interferometers may be found in the reference by Hariharan, which examples are hereby incorporated by reference.

Figure 7:
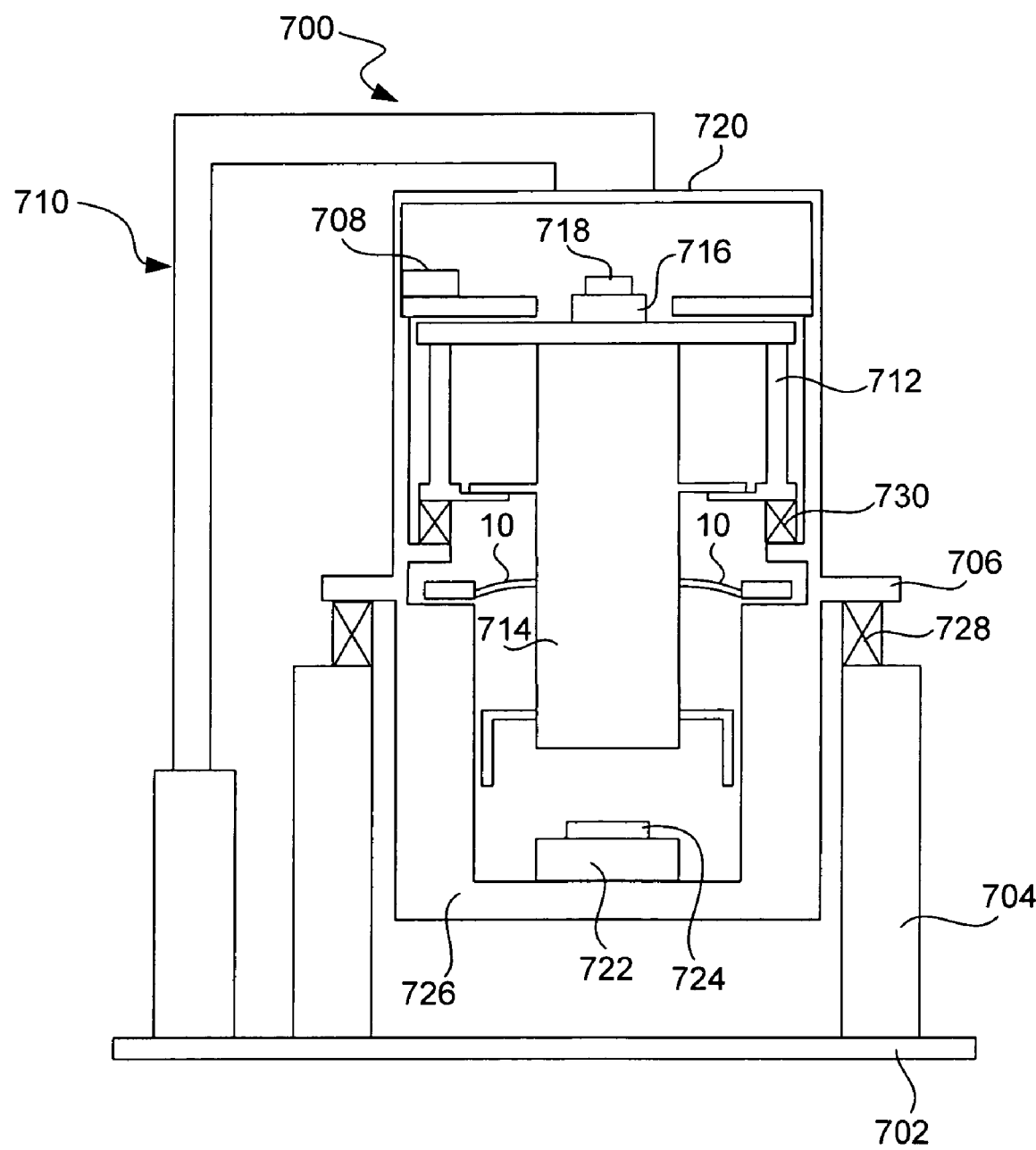
FIG. 7 illustrates a telecentric projection exposure apparatus that can incorporate AF devices and methods of the present invention.

In order to provide a context for some embodiments of the invention, an exemplary telecentric lithography system will now be described with reference to FIG. 7. A typical exposure apparatus 700 includes a mounting base 702, a support frame 704, a base frame 706, a measurement system 708, a control system (not shown), an illumination system 710, an optical frame 712, an optical device 714, a reticle stage 716 for retaining a reticle 718, an upper enclosure 720 surrounding reticle stage 716, a wafer stage 722 for retaining a semiconductor wafer workpiece 724, and a lower enclosure 726 surrounding wafer stage 722.

Support frame 704 typically supports base frame 706 above mounting base 702 through a base vibration isolation system 728. Base frame 706 supports, through an optical vibration isolation system 730, optical frame 712, measurement system 708, reticle stage 716, upper enclosure 720, optical device 714, wafer stage 722, and lower enclosure 726 above base frame 706. Optical frame 712 supports optical device 714 and reticle stage 716 above base frame 706 through optical vibration isolation system 730. As a result thereof, optical frame 712 and its supported components and base frame 706 are effectively attached in series through base vibration isolation system 728 and optical vibration isolation system 730 to mounting base 702. Vibration isolation systems 728 and 730 are designed to damp and isolate vibrations between components of exposure apparatus 700. Measurement system 708 monitors the positions of stages 716 and 722 relative to a reference such as optical device 714 and outputs position data to the control system.

Optical device 714 typically includes a lens assembly that projects and/or focuses the light or beam from an illumination system 710 that passes through reticle 718. Reticle stage 716 is attached to one or more movers (not shown) directed by the control system to precisely position reticle 718 relative to optical device 714. Similarly, wafer stage 722 includes one or more movers (not shown) to precisely position the wafer workpiece 724 relative to optical device (lens assembly) 714.

One or more seals 10 are placed between base frame 706 (the upper enclosure 720) and the lens assembly 714. The described sealing arrangement provides a good seal for the enclosure 720, yet helps prevent the transmission of vibrations between the enclosure and the lens assembly 714.

As will be appreciated by those skilled in the art, there are a number of different types of photolithographic devices. For example, exposure apparatus 700 can be used as a scanning type photolithography system that exposes the pattern from reticle 718 onto wafer 724 with reticle 718 and wafer 724 moving synchronously. In a scanning type lithographic device, reticle 718 is moved perpendicular to an optical axis of lens assembly 714 by reticle stage 716 and wafer 724 is moved perpendicular to an optical axis of lens assembly 714 by wafer stage 722.

Alternately, exposure apparatus 700 can be a step-and-repeat type photolithography system that exposes reticle 718 while reticle 718 and wafer 724 are stationary. In the step and repeat process, wafer 724 is in a constant position relative to reticle 718 and lens assembly 714 during the exposure of an individual field. Subsequently, between consecutive exposure steps, wafer 724 is consecutively moved by wafer stage 722 perpendicular to the optical axis of lens assembly 714 so that the next field of semiconductor wafer 724 is brought into position relative to lens assembly 714 and reticle 718 for exposure. Following this process, the images on reticle 718 are sequentially exposed onto the fields of wafer 724 so that the next field of semiconductor wafer 724 is brought into position relative to lens assembly 714 and reticle 718.

However, the use of exposure apparatus 700 provided herein is not limited to a photolithography system for a semiconductor manufacturing. Exposure apparatus 700, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source (of illumination system 710) can be, for example, a g-line (436 nm), an i-line (365 nm), a KrF excimer laser (248 nm), an ArF excimer laser (193 nm) or an $F_2$ laser (157 nm). Alternatively, the illumination source can also use charged particle beams such as an x-ray beam or an electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

When far ultra-violet rays such as those emitted by an excimer laser are used, lens assembly 714 is preferably composed of materials such as quartz and fluorite that transmit far ultra-violet rays. When the $F_2$ type laser or x-ray is used, lens assembly 714 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. No. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 8:
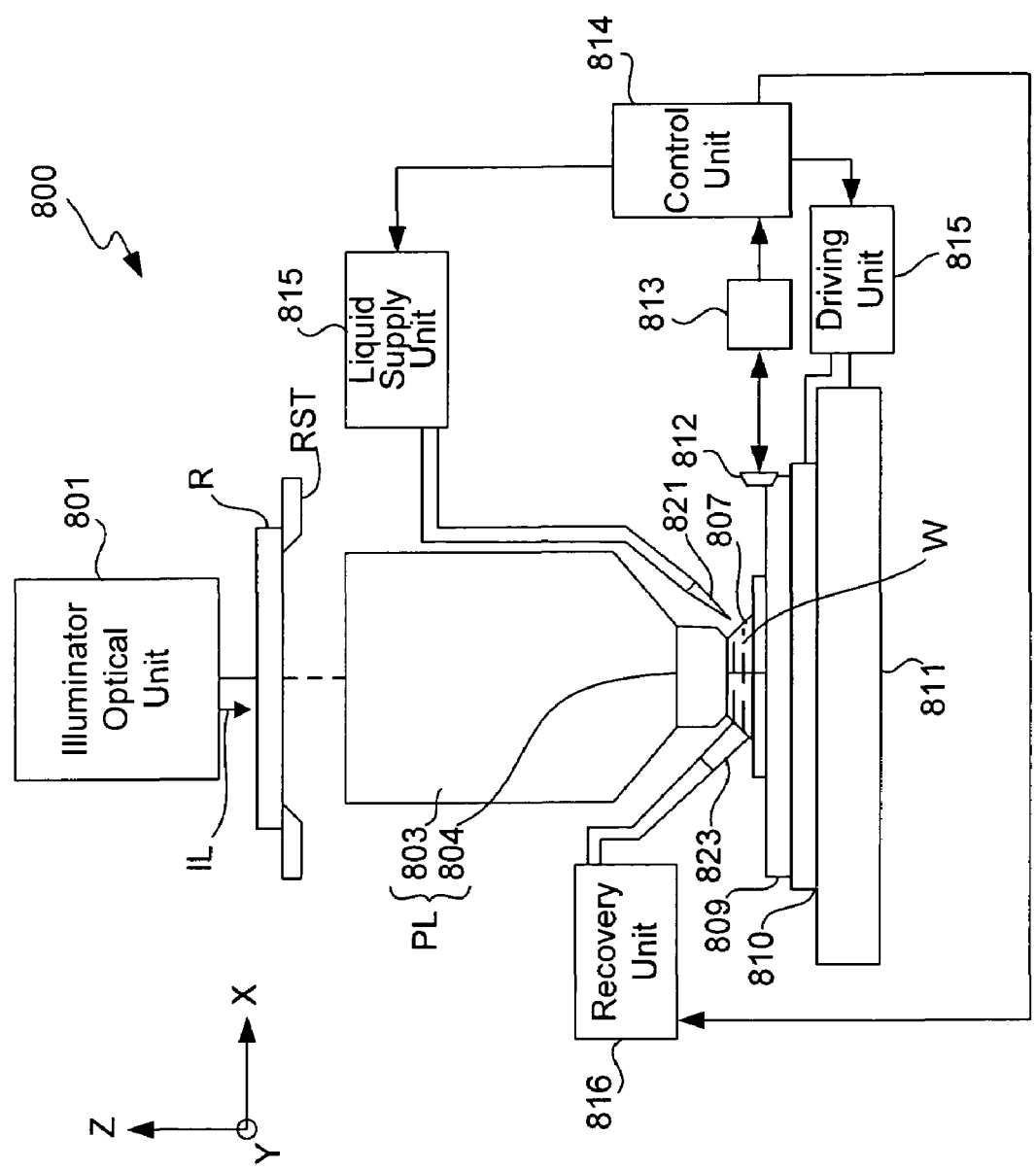
FIG. 8 illustrates an immersion lithography system that can incorporate AF devices and methods of the present invention.

FIG. 8 shows the general structure of an immersion lithography apparatus 100 which may incorporate one or more of the AF systems of this invention. As shown in FIG. 8, the immersion lithography apparatus 800 comprises an illuminator optical unit 801 including a light source such as a KrF excimer laser unit, an optical integrator (or homogenizer) and a lens and serving to emit pulsed ultraviolet light IL with wavelength 248 nm to be made incidence to a pattern on a reticle R. The pattern on the reticle R is projected on a wafer W coated with a photoresist at a specified magnification (such as ¼ or ⅕) through a telecentric light projection unit PL. The pulsed light IL may alternatively be ArF excimer laser light with wavelength 193 nm, $F_2$ laser light with wavelength 157 nm or the i-line of a mercury lamp with wavelength 365 nm. In what follows, the coordinate system with X-, Y- and Z-axes as shown in FIG. 8 is referenced to explain the directions in describing the structure and functions of the lithography apparatus 800. For the convenience of disclosure and description, the light projection unit PL is illustrated in FIG. 8 only by way of its last-stage optical element (such as a lens) 804 disposed opposite to the wafer W and a cylindrical housing 803 containing all of its other components.

The reticle R is supported on a reticle stage RST incorporating a mechanism for moving the reticle R by some amount in the X-direction, the Y-direction and the rotary direction around the Z-axis. The two-dimensional position and orientation of the reticle R on the reticle stage RST are detected by a laser interferometer (not shown) in real time and the positioning of the reticle R is effected by a main control unit 814 on the basis of the detection thus made.

The wafer W is set on a wafer holder (not shown) on a Z-stage 809 for controlling the focusing position (along the Z-axis) and the sloping angle of the wafer W. The Z-stage 809 is affixed to an XY-stage 810 adapted to move in the XY-plane substantially parallel to the image-forming surface of the light projection unit PL. The XY-stage 810 is set on a base 811. Thus, the Z-stage 809 serves to match the wafer surface with the image surface of the light projection unit PL by adjusting the focusing position (along the Z-axis) and the sloping angle of the wafer W by the auto-focusing and auto-leveling method, and the XY-stage 810 serves to adjust the position of the wafer W in the X-direction and the Y-direction.

The two-dimensional position and orientation of the Z-stage 809 (and hence also of the wafer W) are monitored in real time by another laser interferometer 813 with reference to a mobile mirror 812 affixed to the Z-stage 809. Control data based on the results of this monitoring are transmitted from the main control unit 814 to a stage-driving unit 815 adapted to control the motions of the Z-stage 809 and the XY-stage 810 according to the received control data. At the time of an exposure, the projection light is made to sequentially move from one to another of different exposure positions on the wafer W according to the pattern on the reticle R in a step-and-repeat routine.

The lithography apparatus 800 being described with reference to FIG. 8 is an immersion lithography apparatus and is hence adapted to have a liquid (or the "immersion liquid") 807 of a specified kind such as water filling the space between the surface of the wafer W and the lower surface of the last-stage optical element 804 of the light projection unit PL at least while the pattern image of the reticle R is being copied on the wafer W.

The last-stage optical element 804 of the light projection unit PL is affixed to the cylindrical housing 803. In an optional embodiment, the last-stage optical element 804 may be made removable for cleaning or maintenance.

The liquid 807 is supplied from a liquid supply unit 805 that may comprise a tank, a pressure pump and a temperature regulator (not individually shown) to the space above the wafer W under a temperature-regulated condition and is collected by a liquid recovery unit 806. The temperature of the liquid 807 is regulated to be approximately the same as the temperature inside the chamber in which the lithography apparatus 800 itself is disposed. Numeral 821 indicates source nozzles through which the liquid 807 is supplied from the supply unit 805. Numeral 823 indicates recovery nozzles through which the liquid 807 is collected into the recovery unit 806.

The structure described above with reference to FIG. 8 is not intended to limit the scope of the immersion lithography apparatus to which the methods and devices of the present invention are applicable. In other words, autofocus units of the present invention may be incorporated into immersion lithography apparatus of many different kinds. In particular, it is to be reminded that the numbers and arrangements of the source and recovery nozzles 821 and 823 around the light projection unit PL may be designed in a variety of ways for establishing a smooth flow and quick recovery of the immersion liquid 807.

The distance between the last optical element 804 and the wafer photoresist surface must be controlled very precisely in order that the image projected onto the wafer remains in focus. Accordingly an autofocus system must measure the wafer height as close to the image as possible. A conventional glancing angle AF system can measure height at the image location. However the beam must traverse a considerable amount of fluid, and any variation in fluid dimensions or temperature can seriously affect the accuracy. An autofocus system according to the present invention can be placed in proximity to the last optical element 804 or may project its measurement beam through a peripheral region of the last optical element 804 itself. Thus it may measure the height of the wafer close to the image location. If several autofocus systems surround the image region, the height of the wafer at the image location may be inferred by interpolating the several heights measured by the autofocus systems.

The autofocus interferometer beam enters the fluid region through a peripheral region of the last optical element 804 or through an optical surface fixed in relation to the last optical element 804 and approximately normal to the surface of the wafer. The distance traveled through the fluid 807 is accordingly minimal, and thus effects of fluid motion and changes to the index of refraction of the fluid 807 from temperature variations are minimized. The glancing angle autofocus system of the prior art can be seriously affected by such effects. Determination of the photoresist surface is effected in a manner similar to that described above with regard to FIG. 3. However the presence of the fluid will reduce the amount of reflection from the photoresist, leading to a reduction in the reflected signal level. This reduction may place more reliance on the corrections provided by a wafer reflectivity map and the use of Eqs. 5, 6, and 7 above.

Figure 9:
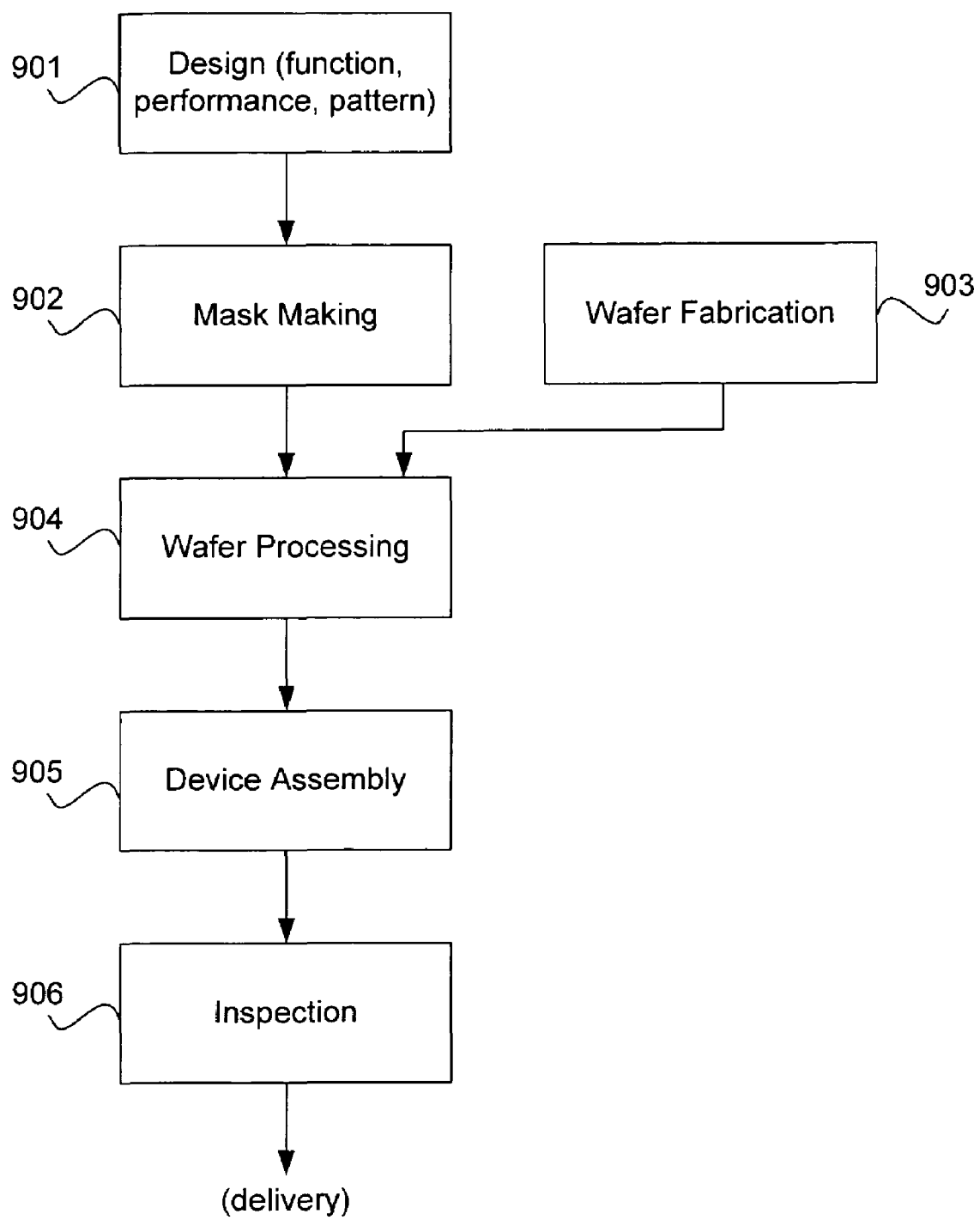
FIG. 9 is a flow chart that outlines some methods according to the present invention.

FIG. 9 is referenced next to describe a process for fabricating a semiconductor device by using an immersion lithography apparatus incorporating a liquid jet and recovery system embodying this invention. In step 901 the device's function and performance characteristics are designed. Next, in step 902, a mask (reticle) having a pattern is designed according to the previous designing step, and in a parallel step 903, a wafer is made from a silicon material. The mask pattern designed in step 902 is exposed onto the wafer from step 903 in step 904 by a photolithography system such as the systems described above. In step 905, the semiconductor device is assembled (including the dicing process, bonding process and packaging process). The device is inspected in step 906.

Figure 10:
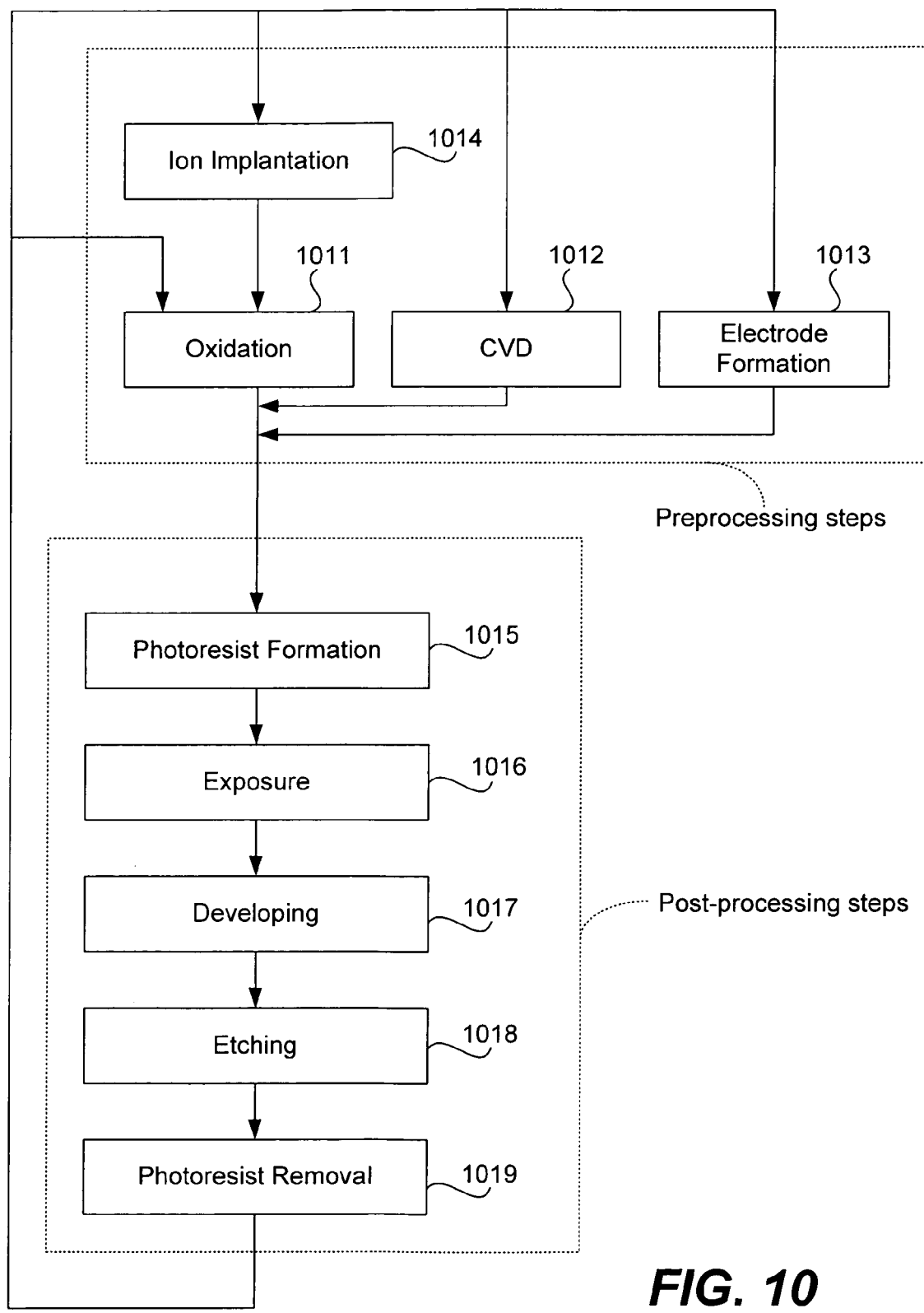
FIG. 10 is a flow chart that outlines alternative methods according to the present invention.

FIG. 10 illustrates a detailed flowchart example of the above-mentioned step 1004 in the case of fabricating semiconductor devices. In step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The aforementioned steps 1011-1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 1015 (photoresist formation step), photoresist is applied to a wafer. Next, in step 1016, (exposure step), the above-mentioned exposure device is used to transfer the circuit pattern of a mask (reticle) to a wafer. Then, in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed. Multiple circuit patterns are formed by repetition of these preprocessing and post-processing steps.

While the invention has been described in terms of several preferred embodiments, there are alterations, permutations, and various equivalents that fall within the scope of this invention. It should also be noted that there are many alternative ways of implementing the methods and devices of the present invention. It is therefore intended that the following appended claims be interpreted as including all such alterations, permutations and various equivalents as fall within the true spirit and scope of the present invention.

I claim:

1. An autofocusing device for a lithography system, the autofocusing device comprising:
   a light source;
   an interferometer system configured to determine a distance to a target based on first light received from the target, the interferometer system comprising a first interferometer and a second interferometer; and
   a spatial filter system, comprising:
      a first spatial filter for passing a specularly reflected component of the first light to the first interferometer; and
      a second spatial filter for passing a selected diffraction order of the first light to the second interferometer.

2. The autofocusing device of claim 1, further comprising a polarizing filter for passing a selected polarization angle of the first light.

3. The autofocusing device of claim 1, wherein the interferometer system is further configured to determine the distance to the target based on a comparison of the first light with second light reflected from a reference mirror.

4. The autofocusing device of claim 1, wherein the target is a surface of a wafer.

5. The autofocusing device of claim 1, wherein the target is a surface of a reticle.

6. The autofocusing device of claim 1, further comprising a calibration device for determining an absolute distance to a target.

7. The autofocusing device of claim 1, further comprising a calibration device for calibrating the autofocusing device for expected optical properties of the target.

8. The autofocusing device of claim 1, further comprising means for causing at least a portion of the first light to illuminate the target more than once.

9. The autofocusing device of claim 7, wherein the expected optical properties comprise an expected reflectivity of a target surface.

10. The autofocusing device of claim 7, wherein the expected optical properties comprise an expected pattern on a target surface.

11. The autofocusing device of claim 8, wherein the causing means comprises a beam splitter and a quarter wave plate.

12. The autofocusing device of claim 1, wherein the spatial filter system further comprises a third spatial filter provided between the target and the first and second spatial filters and wherein the third spatial filter is configured for passing both the specularly reflected component of the first light and the selected diffraction order of the first light.

13. The autofocusing device of claim 1, further comprising means for moving the target in accordance with a determined distance.

14. A lithography system comprising:
   an illumination source;
   an optical system;
   a reticle stage arranged to retain a reticle;
   a working stage arranged to retain a workpiece;
   an enclosure that surrounds at least a portion of the working stage, the enclosure having a sealing surface; and
   autofocusing device, comprising:
      a light source;
      an interferometer system configured to determine a distance to a target based on first light received from the target, the interferometer system comprising a first interferometer and a second interferometer; and
      a spatial filter system, comprising:
         a first spatial filter for passing a specularly reflected component of the first light to the first interferometer; and
         a second spatial filter for passing a selected diffraction order of the first light to the second interferometer, wherein the first spatial filter corresponds to the first interferometer and the second spatial filter corresponds to the second interferometer.

15. A method for making an object using a lithography process, wherein the lithography process utilizes a lithography system as recited in claim 14.

16. A method for patterning a wafer using a lithography process, wherein the lithography process utilizes a lithography system as recited in claim 14.

17. The lithography system of claim 14, wherein the optical system is a telecentric optical system.

18. The lithography system of claim 14, wherein the optical system is a non-telecentric optical system.

19. The lithography system of claim 17, further comprising means for disposing a fluid between the optical system and the workpiece.

20. The autofocusing device of claim 1, further comprising a signal processor configured to determine a height of a selected part of the target based on a signal from the interferometer system.

21. The autofocusing device of claim 20, wherein the interferometer system is configured to produce the signal based on the specularly reflected component of the first light and the selected diffraction order of the first light.

22. An autofocusing device for a lithography system, the autofocusing device comprising:
   a light source;
   an interferometer system configured to determine a distance to a target based on first light received from the target; and
   a spatial filter system for passing selected components of the first light to an interferometer of the interferometer system, the spatial filter system comprising:
      a first spatial filter for passing a specularly reflected component of the first light;
      a second spatial filter for passing a selected diffraction order of the first light; and
      a signal processor configured to determine a height of a selected part of the target based at least in part on signals from the interferometer system, the signals comprising a first signal corresponding to the specularly reflected component of the first light and a second signal corresponding to the selected diffraction order of the first light.

23. The autofocusing device of claim 22, wherein the interferometer system comprises a plurality of interferometers, each interferometer using a different component of the first light to determine the distance to the target.

24. The autofocusing device of claim 1, further comprising a signal processor, the signal processor configured to do the following:
  process a first signal from the first interferometer;
  process a second signal from the second interferometer; and
  determine a height of a selected part of the target based, at least in part, on the first signal and the second signal.

* * * * *

UNITED STATES PATENT AND TRADEMARK OFFICE
CERTIFICATE OF CORRECTION

| | | |
|---|---|---|
| PATENT NO. | : 7,342,641 B2 | Page 1 of 1 |
| APPLICATION NO. | : 11/064169 | |
| DATED | : March 11, 2008 | |
| INVENTOR(S) | : Michael R. Sogard | |

It is certified that error appears in the above-identified patent and that said Letters Patent is hereby corrected as shown below:

In the Claims:

In line 17 of claim 22 (column 22, line 60) change "coffesponding" to --corresponding--.

Signed and Sealed this

Second Day of September, 2008

JON W. DUDAS
*Director of the United States Patent and Trademark Office*